(12) United States Patent
Chang et al.

US011380693B2

(10) Patent No.: US 11,380,693 B2
(45) Date of Patent: Jul. 5, 2022

(54) SEMICONDUCTOR DEVICE INCLUDING ANTI-FUSE CELL STRUCTURE

(71) Applicant: TAIWAN SEMICONDUCTOR MANUFACTURING COMPANY LTD., Hsinchu (TW)

(72) Inventors: Meng-Sheng Chang, Chu-Bei (TW); Yao-Jen Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/533,359

(22) Filed: Aug. 6, 2019

(65) Prior Publication Data
US 2020/0058660 A1    Feb. 20, 2020

Related U.S. Application Data

(60) Provisional application No. 62/720,044, filed on Aug. 20, 2018.

(51) Int. Cl.
*H01L 27/112* (2006.01)
*H01L 23/528* (2006.01)
(Continued)

(52) U.S. Cl.
CPC ...... *H01L 27/11206* (2013.01); *G06F 30/392* (2020.01); *G11C 17/16* (2013.01);
(Continued)

(58) Field of Classification Search
CPC . H01L 27/11206; H01L 23/528; G11C 17/16; G11C 17/17; G06F 30/392
See application file for complete search history.

(56) References Cited

U.S. PATENT DOCUMENTS 9,064,591 B2   6/2015   Kim et al.
9,349,483 B2   5/2016   Joo
(Continued)

FOREIGN PATENT DOCUMENTS

CN   106469727   3/2017

OTHER PUBLICATIONS

Office Action dated May 20, 2020 from corresponding application No. TW 108129687.
(Continued)

*Primary Examiner* — Vongsavanh Sengdara
(74) *Attorney, Agent, or Firm* — Hauptman Ham, LLP

(57) ABSTRACT

A structure includes a word line, a bit line, and an anti-fuse cell. The anti-fuse cell includes a reading device, a programming device, and a dummy device. The reading device includes a first gate coupled to the first word line, a first source/drain region coupled to the bit line, and a second source/drain region. The first source/drain region and the second source/drain region are on opposite sides of the first gate. The programming device includes a second gate, a third source/drain region coupled to the second source/drain region, and a fourth source/drain region. The third source/drain region and the fourth source/drain region are on opposite sides of the second gate. The dummy device includes a third gate, a fifth source/drain region coupled to the fourth source/drain region, and a sixth source/drain region. The fifth source/drain region and the sixth source/drain region are on opposite sides of the third gate.

20 Claims, 28 Drawing Sheets

(51) Int. Cl.
  *G11C 17/16*   (2006.01)
  *G11C 17/18*   (2006.01)
  *H01L 23/525*  (2006.01)
  *G06F 30/392*  (2020.01)

(52) U.S. Cl.
  CPC ............ *G11C 17/18* (2013.01); *H01L 23/528* (2013.01); *H01L 23/5252* (2013.01)

(56) References Cited

U.S. PATENT DOCUMENTS

| | | | |
|---|---|---|---|
| 9,589,970 B1* | 3/2017 | Tseng | H01L 29/0653 |
| 2013/0221313 A1* | 8/2013 | Lee | H01L 27/2472 |
| | | | 257/E45.001 |
| 2016/0093621 A1* | 3/2016 | Choi | H01L 27/1126 |
| | | | 257/365 |
| 2017/0076757 A1* | 3/2017 | Wu | G11C 17/16 |
| 2017/0117284 A1 | 4/2017 | Wu et al. | |
| 2017/0148801 A1* | 5/2017 | Wong | H01L 23/528 |
| 2017/0200727 A1* | 7/2017 | Yoon | H01L 23/5226 |
| 2017/0243660 A1 | 8/2017 | Kim et al. | |
| 2018/0204843 A1* | 7/2018 | Son | H01L 27/11206 |

OTHER PUBLICATIONS

Office Action dated Aug. 29, 2020 from corresponding application No. 10-2019-0101401, pp. 1-4.
Office Action dated Mar. 26, 2021 for corresponding case No. DE 10 2019 121 309.6 (pp. 1-68).
Office Action dated Sep. 8, 2021 for corresponding case No. CN 201910768199.5 (pp. 1-8).

* cited by examiner

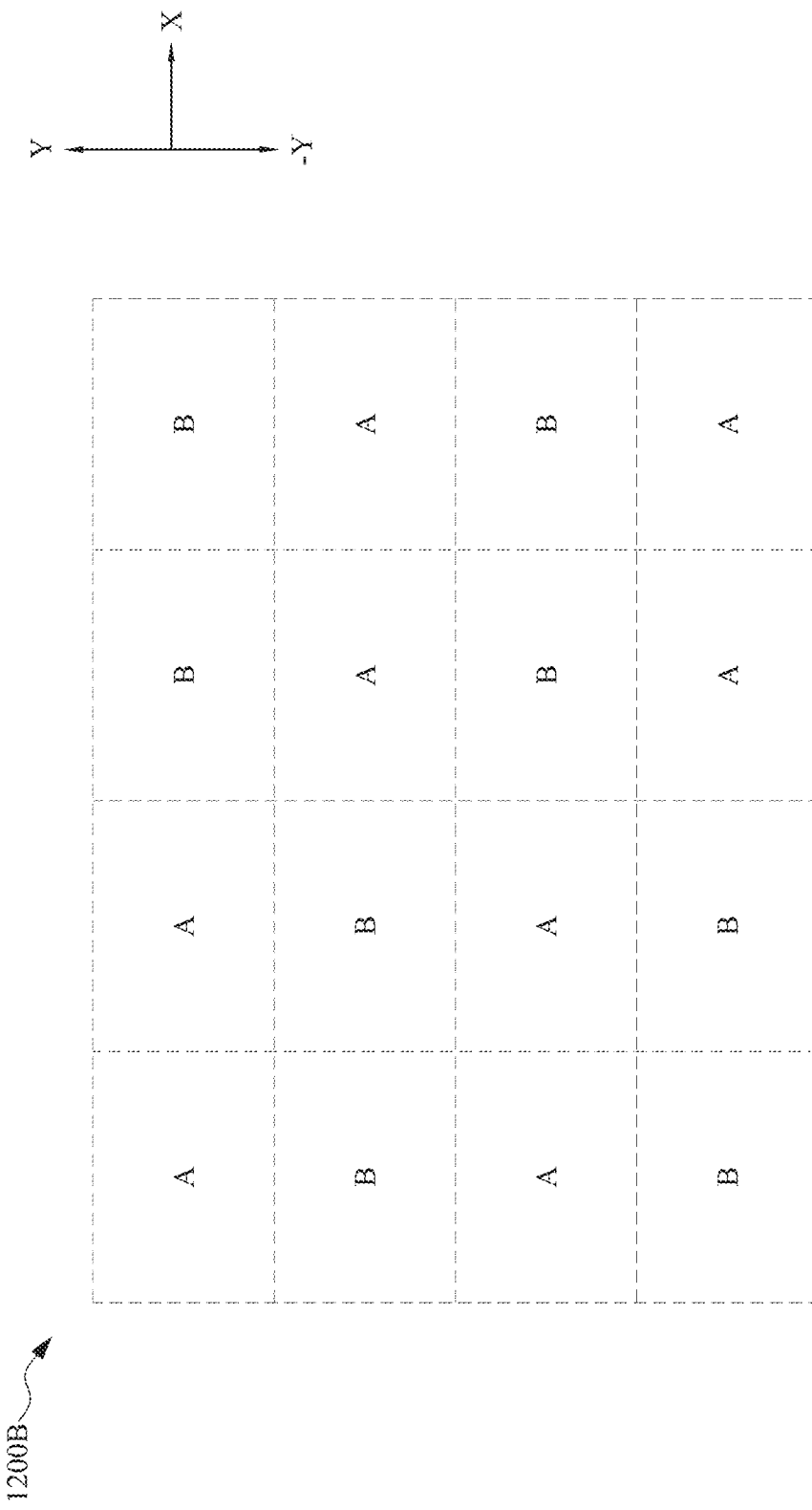

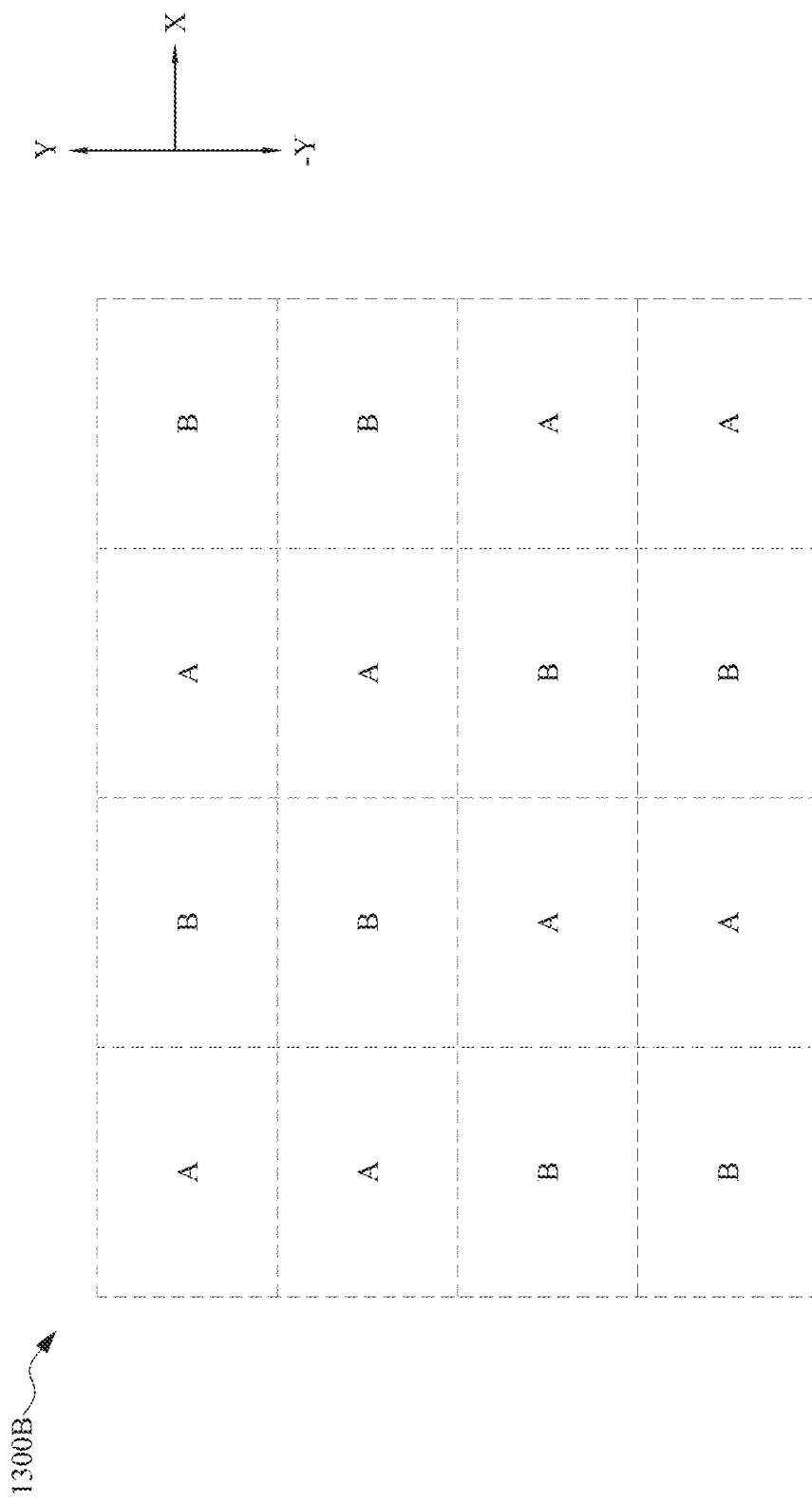

SEMICONDUCTOR DEVICE INCLUDING ANTI-FUSE CELL STRUCTURE

RELATED APPLICATIONS

This application claims priority to U.S. Provisional Application Ser. No. 62/720,044, filed Aug. 20, 2018, which is herein incorporated by reference.

BACKGROUND

A non-volatile memory is able to retain data after the supply power is interrupted. Generally, the non-volatile memory is programmed to record data therein. There are various types of the non-volatile memory, including, for example, a multi-time programming memory (also referred to as MTP memory), a one-time programming memory (also referred to as OTP memory), or the like. Depending on characteristics, the one-time programming memory is also referred to as an anti-fuse memory. Before a memory cell in the one-time programming memory is programmed, the memory cell may have a high resistance storage state, and after the memory cell is programmed, the memory cell may have a low resistance storage state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12B is a top view of a schematic diagram of a layout of layout cells of FIG. 12A, in accordance with some embodiments of the present disclosure.

FIG. 13B is a top view of a schematic diagram of a layout of layout cells of FIG. 13A, in accordance with some embodiments of the present disclosure.

DETAILED DESCRIPTION

Figure 1:
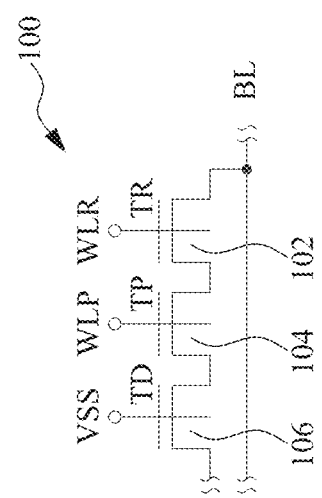
FIG. 1 is a schematic diagram of an anti-fuse memory cell, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," or the like, may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

An anti-fuse memory device and cell structures therein are provided in accordance with various embodiments. Some variations of some embodiments are discussed. Throughout various views and illustrative embodiments, like elements are designated with like reference numbers for ease of understanding.

FIG. 1 is a circuit diagram of an anti-fuse memory cell 100, in accordance with some embodiments of the present disclosure. In some embodiments, the anti-fuse memory cell 100 is also referred to as a one-time programmable (OTP) memory cell. In FIG. 1, the anti-fuse memory cell 100 includes a reading device 102, a programming device 104, and a dummy device 106. The programming device 104 is coupled between the reading device 102 and the dummy device 106, and a terminal of the reading device 102 is coupled to a bit line BL to receive data from the bit line BL. In some embodiments, in a programming operation, the reading device 102 is configured to turn on, and the programming device 104 is configured to be programmed by receiving the data from the bit line BL through the reading device 102. In some embodiments, in a reading operation, after the programming device 104 is programmed, the data in the anti-fuse memory cell 100 is able to be read through the reading device 102. In some embodiments, the dummy device 106 is configured next to the programming device 104 for isolation of the programming device 104 and other devices, or for isolation of the anti-fuse memory cell 100 and an adjacent anti-fuse memory cell (not shown), as will be discussed in detail below.

In some embodiments, the reading device 102, the programming device 104, and the dummy device 106 are implemented with Metal-Oxide-Semiconductor (MOS) transistors. In some embodiments, the reading device 102, the programming device 104, and the dummy device 106 are implemented with N type MOS (NMOS) transistors. Other transistors or transistor types are within the scope of the present disclosure. For example, in some embodiments, one or more of the reading device 102, the programming device 104, and the dummy device 106 are implemented with P-type MOS transistors. The reading device 102, the programming device 104, and the dummy device 106 are implemented with MOS transistors TR, TP, and TD, respectively. A first source/drain terminal of the transistor TR is coupled to the bit line BL, and a gate terminal of the transistor TR is coupled to a read word line that is designated with WLR. A first source/drain terminal of the transistor TP is coupled to a second source/drain terminal of the transistor TR, and a gate terminal of the transistor TP is coupled to a program word line that is designated with WLP. A first source/drain terminal of the transistor TD is coupled to a second source/drain terminal of the transistor TP, and a gate terminal of the transistor TD is coupled to a voltage line that is designated with VSS. As illustrated in FIG. 1, there are two transistors TP and TR, and one transistor TD implementing the dummy device 106. Accordingly, the anti-fuse memory cell 100 is also referred to as a "2T1D" memory cell in some embodiments, in which "T" denotes a transistor and "D" denotes a dummy device/transistor.

The reference designation WLR in the present disclosure denotes a read word line throughout the description. The reference designation WLP in the present disclosure denotes a program word line throughout the description. The reference designations of the features throughout the description may be referred to using the reference designations WLR and WLP followed by a number. For example, when features are denoted as WLR0 and WLR1, they indicates two different read word lines, and when features are denoted as WLP0 and WLP1, they indicates two different program word lines. In some embodiments, the read word line WLR is also referred to as a "selection word line," "word line gate line," and the like. In some embodiments, the program word line WLP is also referred to as "program gate line," "anti-fuse gate line," "anti-fuse control line," and the like.

Similarly, the reference designations TR and TP in the present disclosure denote transistors that are coupled to the read word line WLR and the program word line WLP, respectively, throughout the description. Accordingly, in some embodiments, the transistor TR is also referred to as "selection transistor," and the transistor TP is also referred to as "program transistor." The reference designations of the features throughout the description may be referred to using the reference designations TR and TP followed by a number.

In some embodiments, in a programming operation of the anti-fuse memory cell 100, a ground voltage (0V) is provided to the voltage line VSS and the bit line BL, a select voltage Vdd is provided to the read word line WLR, and a program voltage Vp is provided to the program word line WLP. In the programming operation, transistor TD is turned off in response to the ground voltage, and is configured as an isolation transistor to electrically isolate transistor TP from other devices in an adjacent anti-fuse memory cell (not shown). In some embodiments, the magnitude of the program voltage Vp is larger than that of the select voltage Vdd.

Figure 2A:
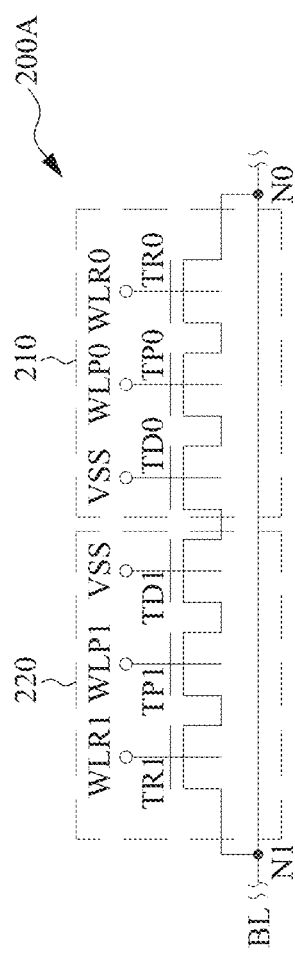
FIG. 2A is a circuit diagram of an anti-fuse memory array, in accordance with some embodiments of the present disclosure.
Figure 2B:
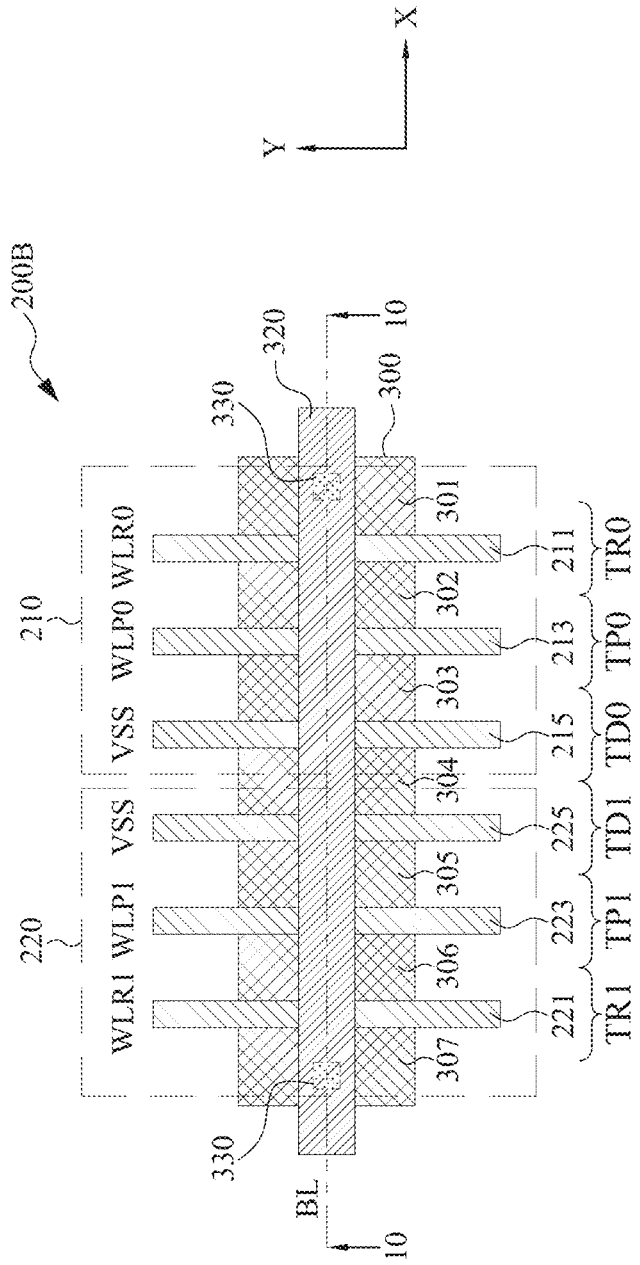
FIG. 2B is a top view of a schematic diagram of a layout structure of the anti-fuse memory array of FIG. 2A, in accordance with some embodiments of the present disclosure.
Figure 2C:
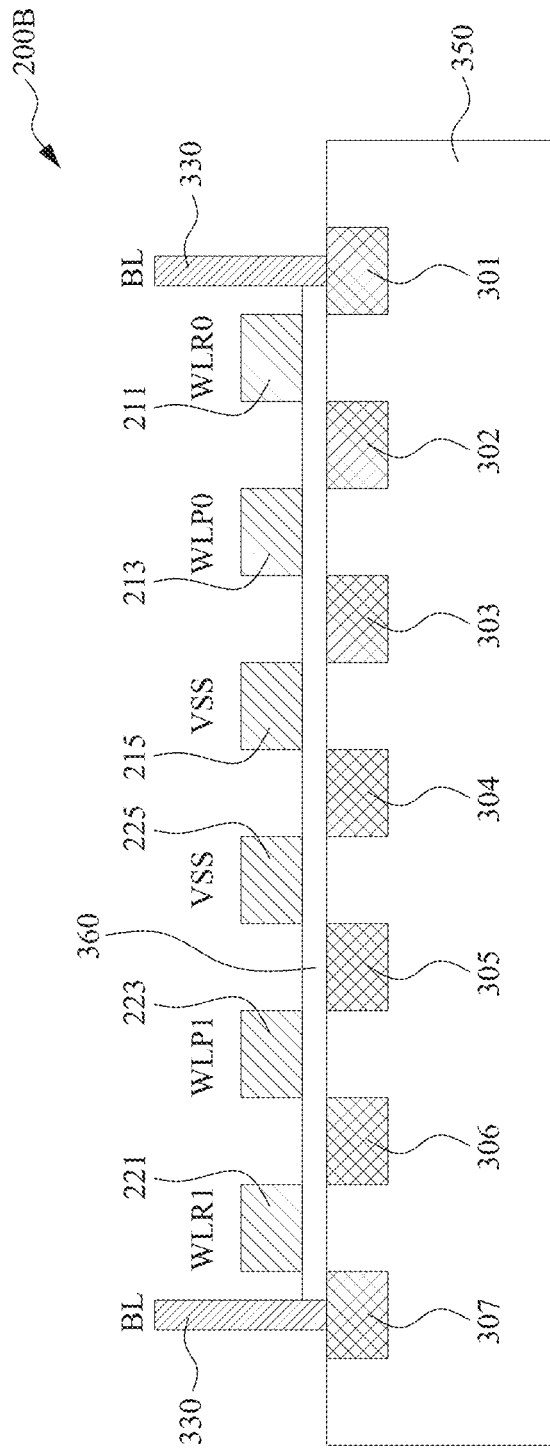
FIG. 2C is a cross-sectional view of the structure of the anti-fuse memory array of FIG. 2B, taken along a line 10-10, in accordance with some embodiments of the present disclosure.

When the transistor TR is turned on in response to the select voltage Vdd applied to the read word line WLR and the ground voltage applied to the bit line BL, the program voltage Vp is applied to the gate oxide layer (such as the gate oxide layer 360 as illustrated in FIG. 2C) of the transistor TP. If the program voltage Vp is greater than a withstanding voltage range of the gate oxide layer, then the gate oxide layer of the transistor TP is ruptured. In some embodiments, the ruptured gate oxide layer is configured as a resistor with a low resistance value. The anti-fuse memory cell 100 accordingly generates a program current flowing to the bit line BL through the turned-on transistor TR.

In some embodiments, during a read operation of the anti-fuse memory cell 100, the ground voltage (0V) is provided to the bit line BL and the voltage line VSS, the select voltage Vdd is provided to the read word line WLR, and a read voltage Vr is provided to the program word line WLP. In the read operation, transistor TD is turned off and is configured as an isolation transistor in response to the ground voltage. When the transistor TR is turned on in response to the select voltage Vdd, transistor TP generates a read current in response to the read voltage Vr. The anti-fuse memory cell 100 accordingly generates the read current flowing through the transistor TR to the bit line BL. According to the magnitude of the read current flowing through the bit line BL, the anti-fuse memory cell 100 is verified to have a storing state in some embodiments. In some embodiments, the magnitude of the select voltage Vdd is the same as that of the read voltage Vr.

Based on the above, with turn-off transistor TD configured as the isolation transistor, transistor TP is configured as the programming device 104 and is electrically isolated from an adjacent anti-fuse memory cell (not shown) next to the anti-fuse memory cell 100. Accordingly, the operation of the programming device 104 is prevented from being affected by other anti-fuse memory cells or devices.

The above implementations of the reading device 102, the programming device 104, and the dummy device 106 are given for illustrative purposes. Various implementations of the reading device 102, the programming device 104, and the dummy device 106 are within the contemplated scope of the present disclosure. For example, depending on various manufacturing processes, the reading device 102, the programming device 104, and the dummy device 106 are implemented with various types of MOS transistors, including, for example, Fin Field Effect Transistors (FinFETs), in various embodiments. For another example, in various embodiments, the reading device 102 and the programming device 104 as discussed above are implemented with a single transistor. The transistors TP and TR as discussed above are manufactured as a single transistor to perform the same functions of the transistors TP and TR.

The configuration of the anti-fuse memory cell 100 as illustrated above is also given for illustrative purposes. Various configurations of the anti-fuse memory cell 100 are within the contemplated scope of the present disclosure. For example, in various embodiments, the gate terminal of the transistor TD of dummy device 106 is not coupled to the voltage line VSS and is electrically floating (unconnected). With the gate terminal of the transistor TD being electrically floating, transistor TD is also configured as an isolation transistor similar to the gate terminal of transistor TD being coupled to voltage line VSS as discussed above. The transistor TD having the gate terminal being electrically floating is applicable in all of the embodiments as discussed in the present disclosure.

FIG. 2A is a circuit diagram of an anti-fuse memory array 200A, in accordance with some embodiments of the present disclosure. As illustrated in FIG. 2A, the anti-fuse memory array 200A includes an anti-fuse memory cell 210 and an anti-fuse memory cell 220. The anti-fuse memory cells 210 and 220, next to each other, are coupled to different read word lines as well as different program word lines. The anti-fuse memory cells 210 and 220 are coupled to the same bit line BL at nodes N0 and N1, respectively. The anti-fuse memory cell 210 includes transistors TR0, TP0, and TD0, and gate terminals of the transistors TR0, TP0, and TD0 are coupled to a read word line WLR0, a program word line WLP0, and the voltage line VSS, respectively. The anti-fuse memory cell 220 includes transistors TR1, TP1, and TD1, and gate terminals of the transistors TR1, TP1, and TD1 are coupled to a read word line WLR1, a program word line WLP1, and the voltage line VSS, respectively. One source/drain terminals of each of the transistors TR0 and TR1 are coupled to the same bit line BL.

The anti-fuse memory cell 210 has a configuration similar to that of the anti-fuse memory cell 100 as illustrated in FIG. 1. Alternatively stated, the connections of the transistors TR0, TP0, and TD0 are similar to the connections of the transistors TR, TP, and TD as discussed above with respect to FIG. 1. Accordingly, the connections of the transistors TR0, TP0, and TD0 in FIG. 2A are not further detailed herein. However, the anti-fuse memory cell 220 has a configuration mirroring that of the anti-fuse memory cell 210 as discussed above. In FIG. 2A, the transistors TD0 and TD1 of anti-fuse memory cell 210 and anti-fuse memory cell 220 are coupled to the voltage line VSS, and are coupled next to each other. The transistors TD0 and TD1 of anti-fuse memory cell 210 and anti-fuse memory cell 220 are coupled in between transistors TR0 and TR1. Transistors TR0 and TR1 are on opposite sides of the anti-fuse memory array 200A. Transistors TD0 and TD1 of anti-fuse memory cell 210 and anti-fuse memory cell 220 are between the transistors TP0 and TP1.

FIG. 2B is a top view of a schematic diagram of a layout structure 200B of the anti-fuse memory array 200A of FIG. 2A, in accordance with some embodiments of the present disclosure. As illustrated in FIG. 2B, the anti-fuse memory cells 210 and 220 include a continuous active region 300, gates 211, 213, 221, and 223, and dummy gates 215 and 225. In some embodiments, the continuous active region 300 is referred to as an "oxide diffusion (OD) region" which defines the source or drain diffusion regions of memory array 200A. The gates 211, 213, the dummy gate 215, and the active region 300 are part of the transistors TR0, TP0, and TD0 of the anti-fuse memory cell 210. The gates 221, 223, the dummy gate 225, and the active region 300 are part of the transistors TR1, TP1, and TD1 of the anti-fuse memory cell 220. In some embodiments, dummy gates 215 and 225 are part of transistors TD0 and TD1, respectively, and transistors TD0 and TD1 are also referred to as dummy transistors. In some embodiments, a "dummy" gate does not act as the gate for MOS devices. In some embodiments, a dummy transistor is a transistor having no function in the circuit.

In some embodiments, the above active region (OD) 300 is formed by an active region forming process, which is also referred to as an "OD process" using OD mask, in some embodiments. In some embodiments, the above gates 211, 213, 221, and 223 and dummy gates 215 and 225 include polysilicon, and are formed by a gate forming process, which is also referred to as an "PO process" using PO mask, in some embodiments. In some embodiments, a cut OD process is omitted which allows to keep the active region (OD) 300 continuous for forming the gates 211, 213, 221, and 223, and dummy gates 215 and 225 thereon. Accordingly, in some embodiments, manufacturing processes are reduced and simplified, compared to some approaches.

In FIG. 2B, the active region 300 extends in the X direction, and the gates 211, 213, 221, 223 and the dummy gates 215, 225 extend in the Y direction to cross over or overlap the active region 300. As a result, the active region 300 includes regions 301-307 arranged on opposite sides of the gates 211, 213, 221, 223 and the dummy gates 215, 225. The regions 301 and 302 are on opposite sides of the gate 211 and are configured as source/drain regions of the transistor TR0. The gate 211 and the regions 301 and 302 in combination are part of the transistor TR0. The regions 302 and 303 are on opposite sides of the gate 213 and are configured as source/drain regions of the transistor TP0. The gate 213 and the regions 302 and 303 in combination are part of the transistor TP0. The regions 303 and 304 are on opposite sides of the dummy gate 215 and are configured as source/drain regions of the transistor TD0 of the anti-fuse memory cell 210. The dummy gate 215 and the regions 303 and 304 in combination are part of the transistor TD0. The regions 306 and 307 are on opposite sides of the gate 221 and are configured as source/drain regions of the transistor TR1. The gate 221 and the regions 306 and 307 in combination are part of the transistor TR1. The regions 305 and 306 are on opposite sides of the gate 223 and are configured as source/drain regions of the transistor TP1. The gate 223 and the regions 305 and 306 in combination are part of the transistor TP1. The regions 304 and 305 are on opposite sides of the dummy gate 225 and are configured as source/drain regions of the transistor TD1 of the anti-fuse memory cell 220. The dummy gate 225 and the regions 304 and 305 in combination are part of the transistor TD1. In some embodiments, the term "source/drain" is referred to as a region that may be a source region or a drain region.

As further illustrated in FIG. 2B, a metal line 320 is disposed over the active region 300 and extends in the X direction to cross over the gates 211, 213, 221, 223 and the dummy gates 215, 225. The metal line 320 is coupled through vias 330 to the regions 301 and 307. The metal line 320 is a bit line BL as illustrated in FIG. 2A, and the vias 330 correspond to the nodes N0 and N1 as illustrated in FIG. 2A.

As discussed above, in a top-down sequence, the gates 211, 213, 221, 223 and the dummy gates 215, 225 are disposed above the active region 300, and the metal line 320 as the bit line BL is disposed above the gates 211, 213, 221, 223 and the dummy gates 215, 225. Moreover, the read word line WLR and the program word line WLP, as discussed above, are disposed above the metal line 320 (discussed below with respect to FIG. 9A). The metal line 320 as the bit line BL is in a metal layer M0 which is also referred to as "Metal-0 layer" in some embodiments. The read word line WLR and the program word line WLP are formed above the metal layer M0 in a metal layer M1 which is also referred to as "Metal-1 layer" in some embodiments. Other layers are within the scope of the present disclosure. At least bit line BL, read word line WLR or program word line WLP being positioned in other metal layers is within the scope of the present disclosure.

In some embodiments, the gates 211, 213, 221, 223 and the dummy gates 215, 225 are polysilicon gates. The material of the gates 211, 213, 221, 223 and the dummy gates 215, 225 is given for illustrative purposes. Various materials of the gates 211, 213, 221, 223 and the dummy gates 215, 225 are within the contemplated scope of the present disclosure. For example, in various embodiments, the gates 211, 213, 221, 223 and the dummy gates 215, 225 comprise metal.

FIG. 2C is a cross-sectional view of layout structure 200B of the anti-fuse memory array 200A of FIG. 2A, taken along a line 10-10, in accordance with some embodiments of the present disclosure. In FIG. 2C with reference to FIG. 2B, the transistors TR0, TP0, TD0, TR1, TP1, and TD1 are constructed with a well region 350. In some embodiments, the well region 350 is formed in, for example, a silicon substrate or a substrate formed of any other applicable semiconductor materials. The regions 301-307 are doped regions within a top surface of the well region 350, and are configured as the source/drain regions, as discussed above. Moreover, a gate oxide layer 360 covers the top surface of the well region 350. In some embodiments, the well region 350 is a P-type well region, and the regions 301-307 are N-type doped regions. In various embodiments, the well region 350 is implemented with a P-type substrate. In some embodiments, the well region 350 is an N-type well region, and the regions 301-307 are P-type doped regions. In various embodiments, the well region 350 is implemented with an N-type substrate. In some embodiments, a region between two adjacent regions of the regions 301-307, or underlying a corresponding gate of gates 211, 213, 221, 223, or dummy gates 215, 225, is referred to as "channel region."

As illustrated in FIG. 2C, the gate 211 is on the gate oxide layer 360 and is over and in between the regions 301 and 302. Moreover, the gate 211 is coupled to the read word line WLR0. The gate 213 is on the gate oxide layer 360 and is over and in between the regions 302 and 303. Moreover, the gate 213 is coupled to the program word line WLP0. The dummy gate 215 is on the gate oxide layer 360 and is over and in between the regions 303 and 304. Moreover, the dummy gate 215 is coupled to the voltage line VSS. The dummy gate 225 is on the gate oxide layer 360 and is over and in between the regions 304 and 305. Moreover, the dummy gate 225 is coupled to the voltage line VSS. The gate 223 is on the gate oxide layer 360 and is over and in between the regions 305 and 306. Moreover, the gate 223 is coupled to the program word line WLP1. The gate 221 is on the gate oxide layer 360 and is over and in between the regions 306 and 307. Moreover, the gate 221 is coupled to the read word line WLR1.

With reference to FIGS. 2B and 2C, the metal line 320 is disposed over the gates 211, 213, 221, 223 and the dummy gates 215, 225. Moreover, the metal line 320 is coupled to the regions 301 and 307 through the vias 330. In some embodiments, the vias 330 are disposed at the layer between the active region 300 and the metal line 320, and are also each referred to as a "VD" via.

The structures of the anti-fuse memory array 200A of FIG. 2A, as illustrated in FIG. 2C, are for illustrative purposes. Various other structures of the anti-fuse memory array 200A of FIG. 2A are within the contemplated scope of the present disclosure. For example, in some embodiments, the structures of the anti-fuse memory array 200A of FIG. 2A include Fin Field Effect Transistors (FinFETs) structures, Metal-Oxide-Semiconductor Field Effect Transistors (MOSFETs) structures, or the like In some approaches, because of design rule limitations of Design Rule Check (DRC) used in integrated circuit manufacturing technology, two adjacent memory cells are on separate regions and/or are separated from each other by a spacing that increases yield. Compared to some approaches, as illustrated in the embodiments of FIG. 2B, the group of transistors TR0 and TP0, the group of transistors TR1 and TP1 and the group of transistors TD0 and TD1 are arranged on the same active region 300 resulting in more relaxed Design Rule Check (DRC) limitations. In some embodiments, DRC limitations include spacing constraints between adjacent memory cells (e.g., 210 and 220) including poly pitches between the adjacent memory cells. By having more relaxed DRC limitations, memory cell 210 and memory cell 220 are spaced closer together than some approaches, resulting in anti-fuse memory array 200A having less area than some approaches.

Figure 2D:
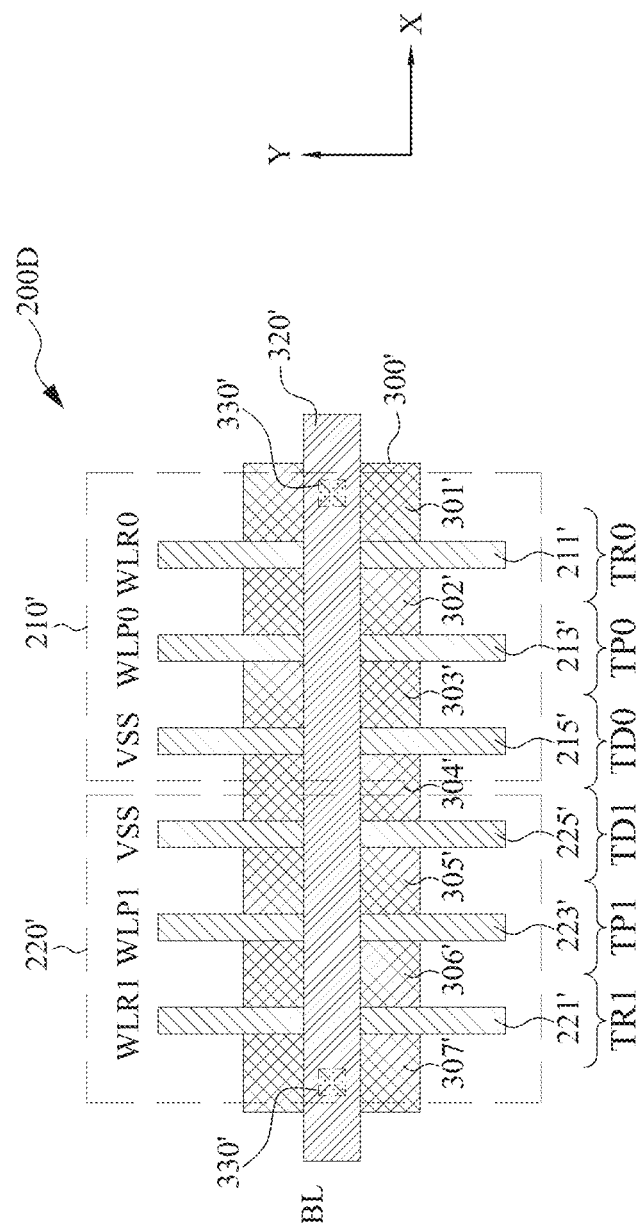
FIG. 2D is a diagram of a layout design, in accordance with some embodiments.

FIG. 2D is a diagram of a layout design 200D of corresponding layout structure 200B, in accordance with some embodiments.

Layout design 200D is a layout design of anti-fuse memory array 200A of FIG. 2A. Layout design 200D is usable to manufacture memory cell 200B or layout structure 200B.

The layout design 200D of anti-fuse memory array 200A has a configuration similar to that of the layout structure 200B of memory cell 200A as illustrated in FIG. 2B, and similar detailed description is therefore omitted. For example, structural relationships including alignment, lengths and widths, levels or layers, as well as configurations of one or more of layout design 200D of FIG. 2D, layout design 300C of FIG. 3C, layout design 400C of FIG. 4C, layout design 500C of FIG. 5C, layout design 700B of FIG. 7B, layout design 800B of FIG. 8B, layout design 900B of FIG. 9B or layout design 1100C of FIG. 11C are similar to the structural relationships and configurations of one or more of layout structure 200B of FIGS. 2B-2C, layout structure 300B of FIG. 3B, layout structure 400B of FIG. 4B, layout structure 500B of FIG. 5B, layout structure 700A of FIG. 7A, layout structure 800A of FIG. 8A, layout structure 900A of FIG. 9A or layout structures 1100A-1100B of FIGS. 11A-11B, and similar detailed description will not be described for brevity.

Layout design 200D includes active region layout pattern 300', gate layout patterns 211', 213', 221' and 223', dummy gate layout patterns 215' and 225', metal line layout pattern 320' and via layout patterns 330'.

In some embodiments, active region layout pattern 300' is usable to manufacture corresponding active region 300.

In some embodiments, active region layout patterns 301', 302', 303', 304', 305', 306' and 307' of the active region layout pattern 300' are usable to manufacture corresponding regions 301, 302, 303, 304, 305, 306 and 307 of the active region 300.

In some embodiments, gate layout patterns 211', 213', 221' and 223' are usable to manufacture corresponding gates 211, 213, 221 and 223.

In some embodiments, dummy gate layout patterns 215' and 225' are usable to manufacture corresponding dummy gates 215 and 225.

In some embodiments, metal line layout pattern 320' is usable to manufacture corresponding metal line 320.

In some embodiments, via layout patterns 330' are usable to manufacture corresponding vias 330. Other configurations or quantities of patterns in layout design 200D are within the scope of the present disclosure.

Figure 3A:
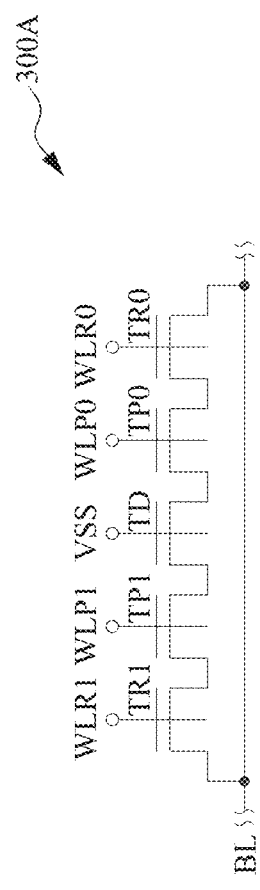
FIG. 3A is a circuit diagram of an anti-fuse memory array in accordance with various embodiments of the present disclosure.
Figure 3B:
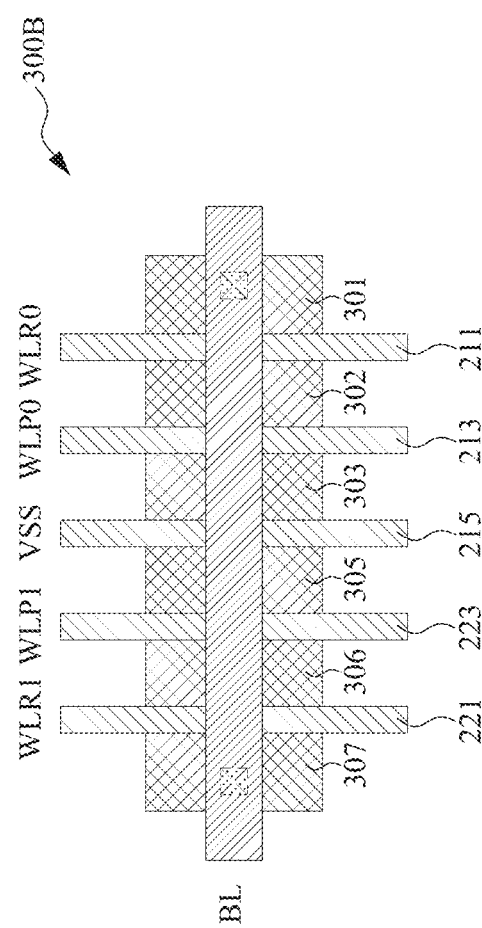
FIG. 3B is a top view of a schematic diagram of a layout structure of the anti-fuse memory array of FIG. 3A, in accordance with some embodiments of the present disclosure.

FIG. 3A is a circuit diagram of an anti-fuse memory array 300A in accordance with various embodiments of the present disclosure. FIG. 3B is a top view of a schematic diagram of a layout structure 300B of the anti-fuse memory array 300A of FIG. 3A, in accordance with some embodiments of the present disclosure. Compared to FIG. 2A, the layout structure 300B of anti-fuse memory array 300A in FIG. 3A includes a single transistor TD to implement the dummy device between the transistors TP0 and TP1. Alternatively stated, the memory cell including the transistors TR0 and TP0 and the memory cell including the transistors TR1 and TP1 share one transistor TD. The shared transistor TD is configured as the isolation transistor for electrically isolating the transistors TP0 and TP1 from each other. As compared to FIG. 1, there are four transistors TP0, TP1, TR0, and TR1 with one transistor TD in the anti-fuse memory array 300A. Accordingly, the anti-fuse memory array 300A is also referred to as a "4T1D" memory cell in some embodiments.

In FIG. 3B, compared to FIG. 2B, layout structure 300B includes dummy gate 215 arranged between the gates 213 and 223, and the regions 303 and 305 are on opposite sides of the dummy gate 215 and configured as the source/drain regions of the transistor TD. The dummy gate 215 and the regions 303 and 305 in combination are part of the transistor TD. Alternatively stated, compared to FIG. 2B, anti-fuse memory array 300B does not include the dummy gate 225 and the region 304. With the layout structure 300B of FIG. 3B, the layout area of the anti-fuse memory array 300A is reduced, compared to some approaches.

Figure 3C:
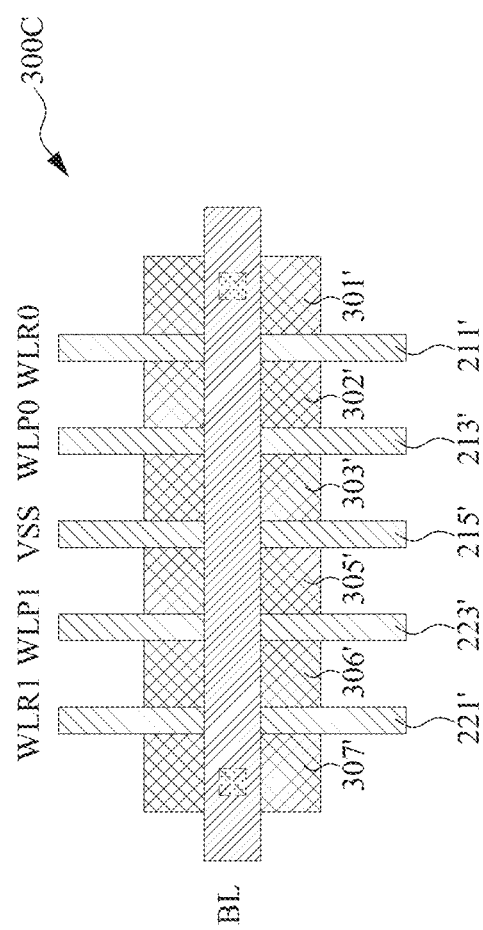
FIG. 3C is a diagram of a layout design, in accordance with some embodiments.

FIG. 3C is a diagram of a layout design 300C of corresponding layout structure 300B, in accordance with some embodiments.

Layout design 300C is a layout design of anti-fuse memory array 300A of FIG. 3A. Layout design 300C is usable to manufacture anti-fuse memory array 300A or layout structure 300B.

The layout design 300C of anti-fuse memory array 300A has a configuration similar to that of the layout structure 300B of anti-fuse memory array 300A as illustrated in FIG. 3B, and similar detailed description is therefore omitted.

In some embodiments, layout design 300C is a variation of layout design 200D. In comparison with layout design 200D of FIG. 2D, layout design 300C does not include region layout pattern 304' and dummy gate layout pattern 225', and similar detailed description is therefore omitted. Other configurations or quantities of patterns in layout design 300C are within the scope of the present disclosure.

Figure 4A:
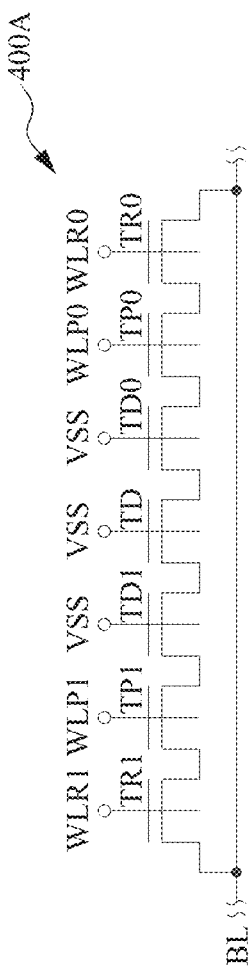
FIG. 4A is a circuit diagram of an anti-fuse memory array, in accordance with various embodiments of the present disclosure.
Figure 4B:
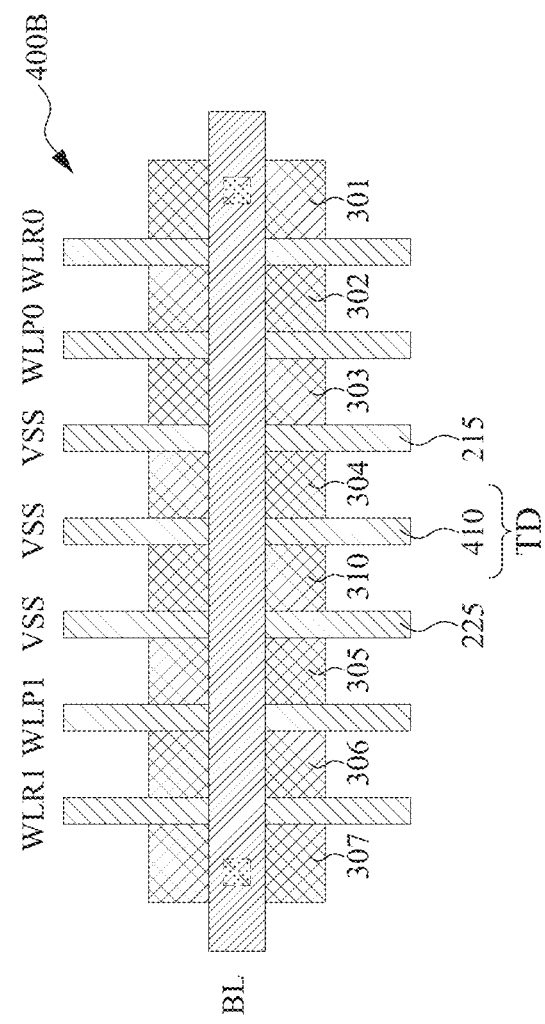
FIG. 4B is a top view of a schematic diagram of a layout structure of the anti-fuse memory array of FIG. 4A, in accordance with some embodiments of the present disclosure.

FIG. 4A is a circuit diagram of an anti-fuse memory array 400A, in accordance with various embodiments of the present disclosure. FIG. 4B is a top view of a schematic diagram of a layout 400B of the anti-fuse memory array 400A of FIG. 4A, in accordance with some embodiments of the present disclosure. Compared to FIG. 2A, the anti-fuse memory array 400A in FIG. 4A further includes an additional transistor TD. Accordingly, anti-fuse memory array 400A includes three transistors TD0, TD1, TD configured as a dummy device between the transistors TP0 and TP1. Alternatively stated, anti-fuse memory array 400A includes three transistors TD0, TD1, TD configured as the isolation transistors for electrically isolating the transistors TP0 and TP1 from each other. As compared to FIG. 1, there are four transistors TP0, TP1, TR0, and TR1 with three transistors TD0, TD1, TD in the anti-fuse memory array 400A. Accordingly, the anti-fuse memory array 400A is also referred to as a "4T3D" memory cell in some embodiments. In some embodiments, the "4T3D" memory cell is a combination of a "2T2D" memory cell and a "2T1D" memory cell.

In FIG. 4B, compared to FIG. 2B, layout structure 400B includes an additional dummy gate 410 arranged between the dummy gates 215 and 225. The regions 304 and 310 are on opposite sides of the additional dummy gate 410 and configured as the source/drain regions of the additional transistor TD. The additional dummy gate 410 and the regions 304 and 310 in combination are part of the additional transistor TD. The regions 305 and 310 are on opposite sides of the dummy gate 225 and configured as the source/drain regions of the transistor TD1. The dummy gate 225 and the regions 305 and 310 in combination are part of the transistor TD next to the transistor TP1.

In accordance with the embodiments discussed above with respect to FIGS. 2A-2B, 3A-3B, and 4A-4B, the number of transistors TD or dummy gates corresponding to transistors TD is for illustrative purposes. Various numbers of transistors TD or dummy gates corresponding to transistors TD are within the contemplated scope of the present disclosure. Alternatively stated, the number of transistors TD or dummy gates corresponding to transistors TD is one or more.

Figure 4C:
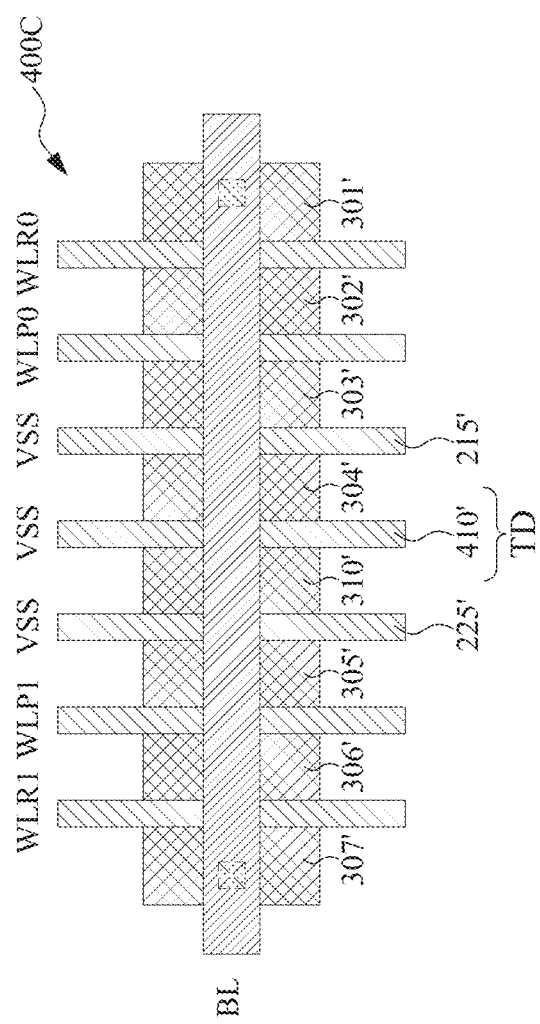
FIG. 4C is a diagram of a layout design, in accordance with some embodiments.

FIG. 4C is a diagram of a layout design 400C of corresponding layout structure 400B, in accordance with some embodiments.

Layout design 400C is a layout design of anti-fuse memory array 400A of FIG. 4A. Layout design 400C is usable to manufacture anti-fuse memory array 400A or layout structure 400B.

The layout design 400C of anti-fuse memory array 400A has a configuration similar to that of the layout structure 400B of anti-fuse memory array 400A as illustrated in FIG. 4B, and similar detailed description is therefore omitted.

In some embodiments, layout design 400C is a variation of layout design 200D. In comparison with layout design 200D of FIG. 2D, layout design 400C further includes a region layout pattern 310' and a dummy gate layout pattern 410', and similar detailed description is therefore omitted.

In some embodiments, active region layout pattern 310' of active region layout pattern 300' is usable to manufacture corresponding region 310 of the active region 300.

In some embodiments, dummy gate layout pattern 410' is usable to manufacture corresponding dummy gate 410. Other configurations or quantities of patterns in layout design 400C are within the scope of the present disclosure.

Figure 5A:
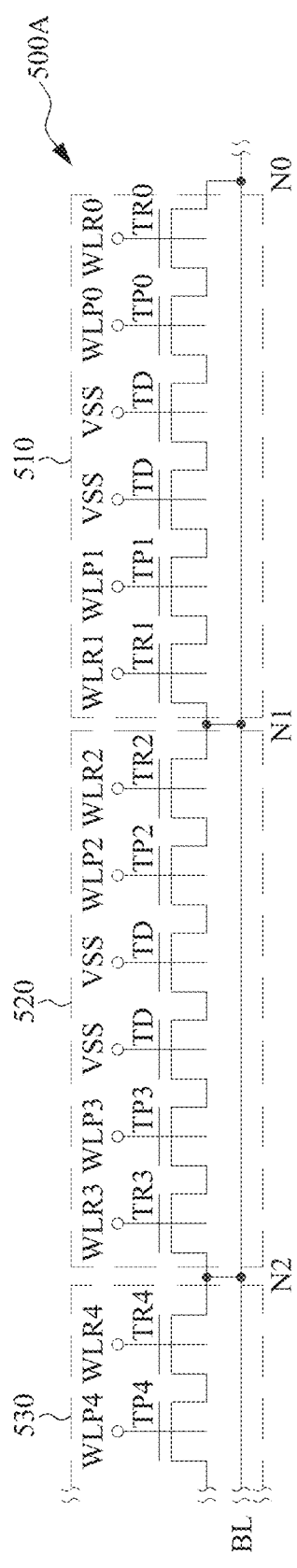
FIG. 5A is a circuit diagram of an anti-fuse memory array, in accordance with various embodiments of the present disclosure.

FIG. 5A is a circuit diagram of an anti-fuse memory array 500A, in accordance with various embodiments of the present disclosure. In FIG. 5A, the anti-fuse memory array 500A includes two memory array cells 510 and 520. The memory array cell 510 is similar to anti-fuse memory array 200A as illustrated in FIG. 2A or 2B. The memory array cell 520 is similar to that of the memory array cell 510, but the memory array cell 520 is coupled to read word lines and program word lines that are different from the read word lines and program word lines coupled to the memory array cell 510.

The memory array cell 520 includes transistors TR2, TP2, TR3, TP3, and two transistors TD that are coupled between the transistors TP2 and TP3. Transistors TD are coupled to each other. The transistor TP2 is coupled between the transistors TR2 and TD. The transistor TP3 is coupled between the transistors TR3 and TD. The transistors TR2, TR3, TP2, TP3 are coupled to read word lines WLR2, WLR3 and program word lines WLP2, WLP3, respectively. A source/drain terminal of the transistor TR2 and a source/drain terminal of the transistor TR1 are coupled with each other to the bit line BL at the node N1. A source/drain terminal of the transistor TR3 is coupled to at least the same bit line BL at a node N2. With the arrangement of FIG. 5A, each memory cell includes one transistor TR and one transistor TP configured to share the same bit line BL as well as including corresponding read word line WLR and corresponding program word line WLP. With the arrangement of FIG. 5A, each memory array cell (e.g., 510 or 520) is also referred to as a "4T2D" memory cell, or a combination of two "2T1D" memory cells, in some embodiments.

In FIG. 5A, a portion of an additional memory array cell 530 that includes transistors TR4 and TP4, and is similar to memory array unit 510, in some embodiments. The additional memory array cell 530 is coupled to the memory array cell 520 and the same bit line BL at the node N2. The transistors TR4 and TP4 are coupled to a read word line WLR4 and a program word line WLP4, respectively. For simplicity of illustration, other transistors in the additional memory array cell are not shown and described herein.

Figure 5B:
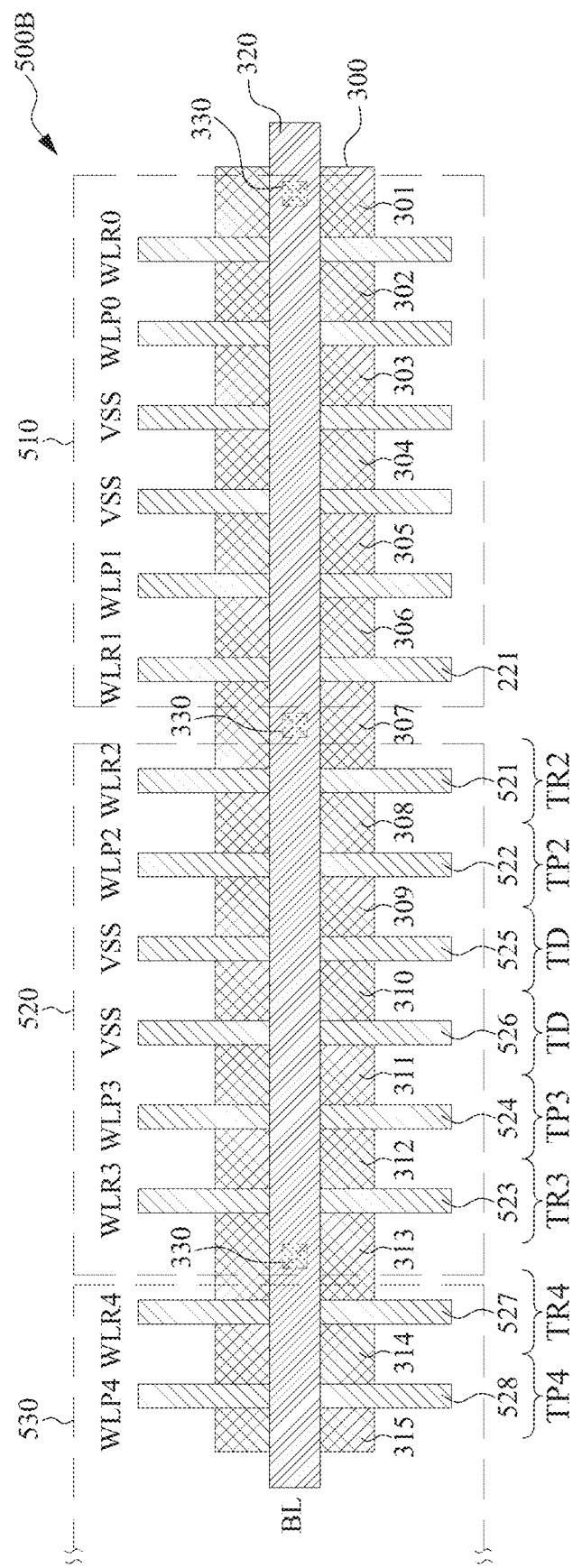
FIG. 5B is a top view of a schematic diagram of a layout structure of the anti-fuse memory array of FIG. 5A, in accordance with some embodiments of the present disclosure.

FIG. 5B is a top view of a schematic diagram of a layout structure 500B of the anti-fuse memory array 500A of FIG. 5A, in accordance with some embodiments of the present disclosure. As illustrated in FIG. 5B, the memory array cell 510 has a layout structure similar to the layout structure 200B of anti-fuse memory array 200A as illustrated in FIG. 2B. The memory array cell 520 has a layout structure similar to that of the layout structure of memory array cell 510, but memory array cell 520 is coupled to different corresponding read word lines and different corresponding program word lines, as discussed above for FIG. 5A. The memory array unit 520 includes gates 521-524 and dummy gates 525, 526. The gates 521-524 and the dummy gates 525, 526 cross over the same active region 300. Active region 300 includes regions 308-313 arranged on corresponding sides of gate 521, gate 522, dummy gate 525, dummy gate 526, gate 524, gate 523. The regions 308-313 are configured as corresponding source/drain regions of transistors TR2, TP2, TD, TD, TR3, and TP3 as discussed above. In some embodiments, at least one of the gates 521-524 or the dummy gates 525, 526 is polysilicon gate. Various types of the gates 521-524 and the dummy gates 525, 526 are within the contemplated scope of the present disclosure.

In FIG. 5B, regions 307 and 308 are on opposite sides of the gate 521, and together are part of the transistor TR2. The gate 522 and the regions 308 and 309 on opposite sides of the gate 522 in combination are part of the transistor TP2. The gate 525 and the regions 309 and 310 on opposite sides of the gate 525 in combination are part of the transistor TD. The gate 526 and the regions 310 and 311 on opposite sides of the gate 526 in combination are part of the transistor TD. The gate 524 and the regions 311 and 312 on opposite sides of the gate 524 in combination are part of the transistor TP3. The gate 523 and the regions 312 and 313 on opposite sides of the gate 523 in combination are part of the transistor TR3. The metal line 320 is over the active region 300 and also crosses over the gates 521-524 and the dummy gates 525, 526. The metal line 320 is coupled through the vias 330 to the regions 301, 307, and 313, and is configured as the shared or common bit line BL. The vias 330 coupled to the regions 301, 307, and 313 correspond to the nodes N0, N1, and N2 as illustrated in FIG. 5A.

In some embodiments, each source/drain region is between a pair of gates, such that two transistors as formed are arranged to share one source/drain region. For example, the region 307 as the source/drain region is between the gates 221 and 521, and the transistors TR1 and TR2 share the region 307, as illustrated in FIG. 5B. According to various manufacturing processes, in various embodiments, an adjacent pair of transistors is referred to as having respective source/drain regions that are coupled to each other. For example, the transistors TR1 and TR2 has respective source/drain regions that are coupled to each other, and are further coupled to the metal line 320 by the through via 330.

In FIG. 5B, the additional memory array cell 530 including the transistors TR4 and TP4, as discussed above in FIG. 5A, includes corresponding gates 527, 528. The gates 527, 528 cross over the active region 300, such that the active region 300 includes regions 314, 315 arranged on a corresponding side of the gates 527, 528, configured as transistors TR4 and TP4. Other gates and regions on corresponding sides thereof are not shown and described herein, for simplicity.

Figure 5C:
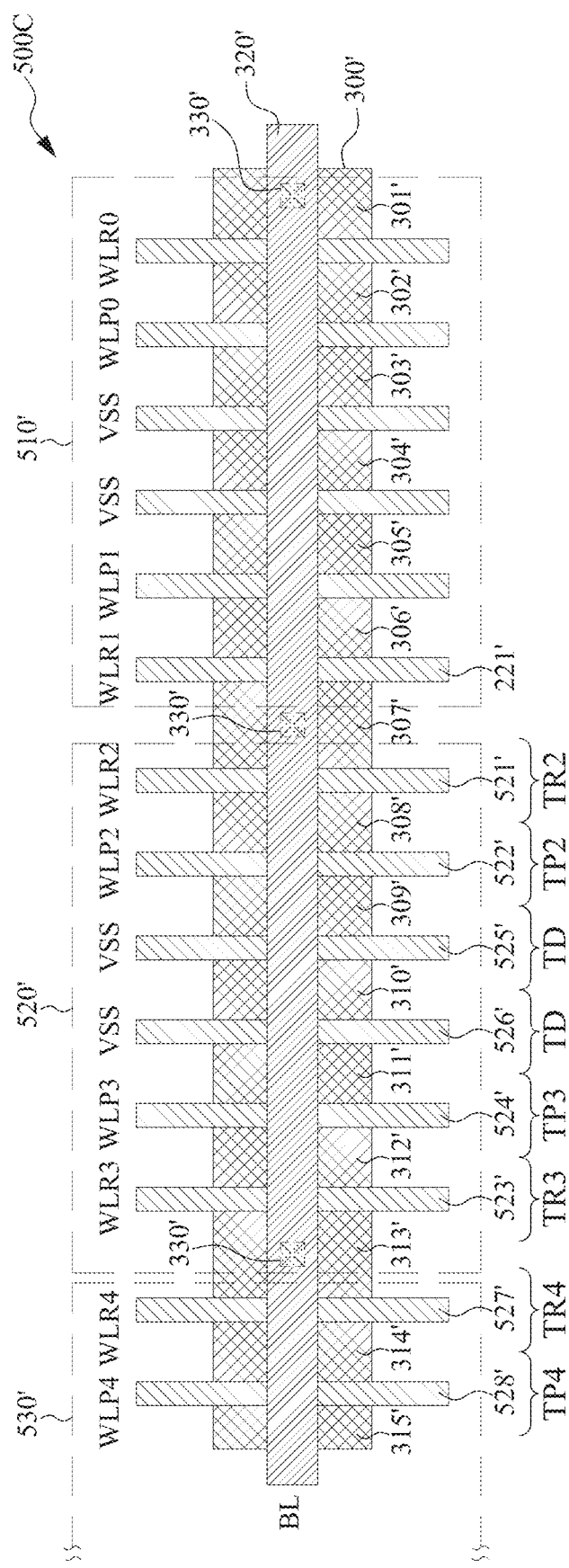
FIG. 5C is a diagram of a layout design, in accordance with some embodiments.

FIG. 5C is a diagram of a layout design 500C of corresponding layout structure 500B, in accordance with some embodiments.

Layout design 500C is a layout design of anti-fuse memory array 500A of FIG. 5A. Layout design 500C is usable to manufacture anti-fuse memory array 500A or layout structure 500B.

The layout design 500C of memory cell 500A has a configuration similar to that of the layout structure 500B of memory cell 500A as illustrated in FIG. 5B, and similar detailed description is therefore omitted.

In some embodiments, layout design 500C is a variation of layout design 200D. In comparison with layout design 200D of FIG. 2D, layout design 500C further includes active region layout patterns 308', 309', 310', 311', 312', 313', 314' and 315', gate layout patterns 521', 522', 523', 524', 527' and 528' and dummy gate layout patterns 525' and 526'.

In some embodiments, active region layout patterns 308', 309', 310', 311', 312', 313', 314' and 315' of the active region layout pattern 300' are usable to manufacture corresponding regions 308, 309, 310, 311, 312, 313, 314 and 315 of the active region 300.

In some embodiments, gate layout patterns 521', 522', 523', 524', 527' and 528' are usable to manufacture corresponding gates 521, 522, 523, 524, 527 and 528.

In some embodiments, dummy gate layout patterns 525' and 526' are usable to manufacture corresponding dummy gates 525 and 526. Other configurations or quantities of patterns in layout design 500C are within the scope of the present disclosure.

Figure 6:
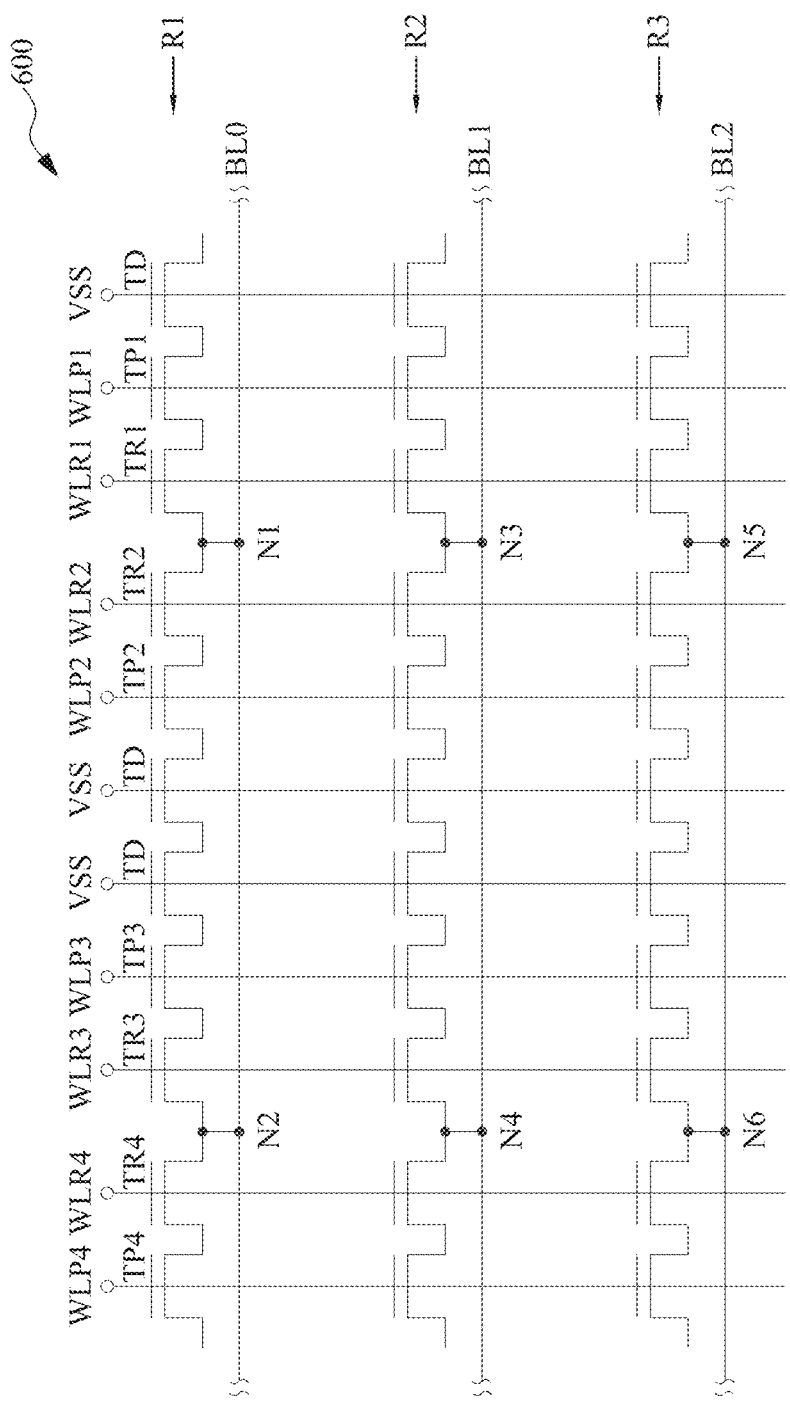
FIG. 6 is a circuit diagram of an anti-fuse memory array, in accordance with various embodiments of the present disclosure.

FIG. 6 is a circuit diagram of an anti-fuse memory array 600, in accordance with various embodiments of the present disclosure. In FIG. 6, the anti-fuse memory array 600 includes a circuit configuration that corresponds to a portion of anti-fuse memory array 500A, as illustrated in FIG. 5A. As shown in FIG. 6, the anti-fuse memory array 600 includes a first row R1 of memory cells, a second row R2 of memory cells and a third row R3 of memory cells. The first row R1 of memory cells are coupled to a bit line BL0 at nodes N1 and N2. The transistors in the first row R1 of memory cells are coupled to the read word lines WLR1-WLR4, the program word lines WLP1-WLP4, and the voltage line VSS, respectively, as discussed above in FIG. 5A. The second row R2 of memory cells are coupled to a bit line BL1 at nodes N3 and N4. The third row R3 of memory cells are coupled to a bit line BL2 at nodes N5 and N6. Each of the second row R2 and the third row R3 of memory cells has a circuit configuration similar to that of the first row R1 of memory cells. Stated differently, transistors in the second row R2 and the third row R3 are correspondingly coupled to the read word lines WLR1-WLR4, the program word lines WLP1-WLP4, and the voltage line VSS, respectively similar to that shown for the transistors in the first row R1.

FIG. 6 shows three rows of memory cells, coupled to the bit lines BL0-BL2, respectively, for illustrative purposes only. Other numbers of rows of memory cells, coupled to the corresponding bit lines, word lines, and voltage line, are within the contemplated scope of the present disclosure.

Figure 7A:
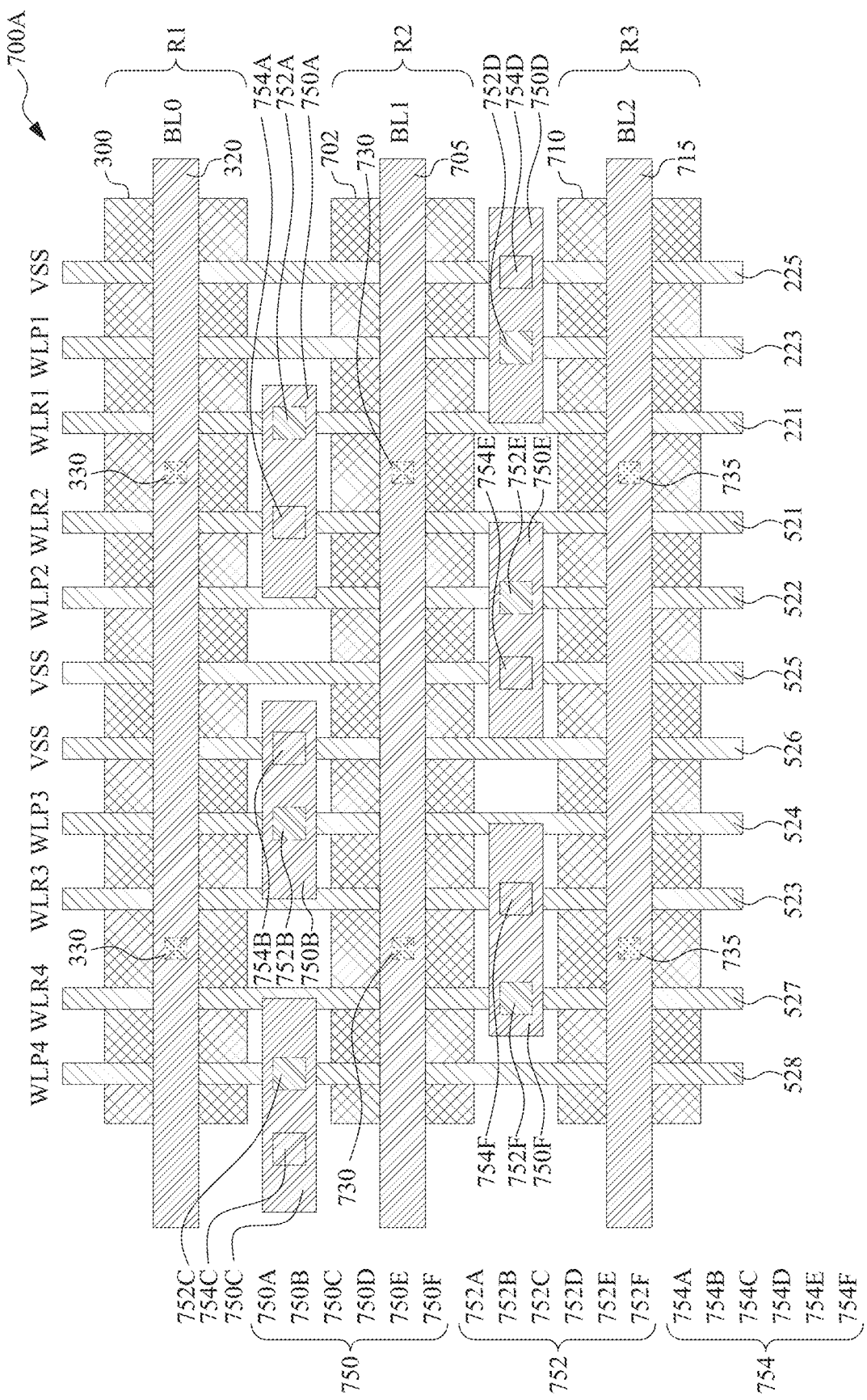
FIG. 7A is a top view of a schematic diagram of a layout structure of the anti-fuse memory array of FIG. 6, in accordance with some embodiments of the present disclosure.

FIG. 7A is a top view of a schematic diagram of a layout structure 700A of the anti-fuse memory array 600 of FIG. 6, in accordance with some embodiments of the present disclosure. In FIG. 7A, the first row R1 of memory cells in the anti-fuse memory array 600 has a layout structure that is similar to a portion of the layout structure 500B of anti-fuse memory array 500A of FIG. 5B. In addition, the layout structure 700A of anti-fuse memory array 600 further includes continuous active regions 702 and 710. The active regions 300, 702 and 710 are separate and/or disconnected from each other and extend in the same direction (e.g., X direction). In some embodiments, the active regions 702 and 710 have the same semiconductor material as that of the active region 300.

In comparison with layout structure 500B of FIG. 5B, the gates 221, 223, 521-524, 527, 528 and the dummy gates 225, 525, 526 are extended to further cross over the active regions 702 and 710. Each one of the active regions 702 and 710 accordingly includes regions, configured as source/drain regions, on each side of the gates 221, 223, 521-524, 527, 528 and the dummy gates 225, 525, 526. The gates 221, 223, 521-524, 527, 528 and the dummy gates 225, 525, 526 in combination with the regions on each side thereof accordingly are part of the transistors corresponding to those in FIG. 6.

Layout structure 700A further includes metal lines 705 and 715 disposed over the active regions 702 and 710, respectively. The metal lines 705 and 715 extend in the same direction as that of the active regions 702 and 710, and are configured as the common bit lines BL1 and BL2 as shown in FIG. 6. The metal lines 705 and 715 also cross over the gates 221, 223, 521-524, 527, 528 and the dummy gates 225, 525, 526. The metal line 705 is coupled through vias 730 to the active region 702, and the vias 730 correspond to the nodes N3 and N4 as illustrated in FIG. 6. The metal line 715 is coupled through vias 735 to the active region 710, and the vias 735 correspond to the nodes N5 and N6 as illustrated in FIG. 6.

Figure 9A:
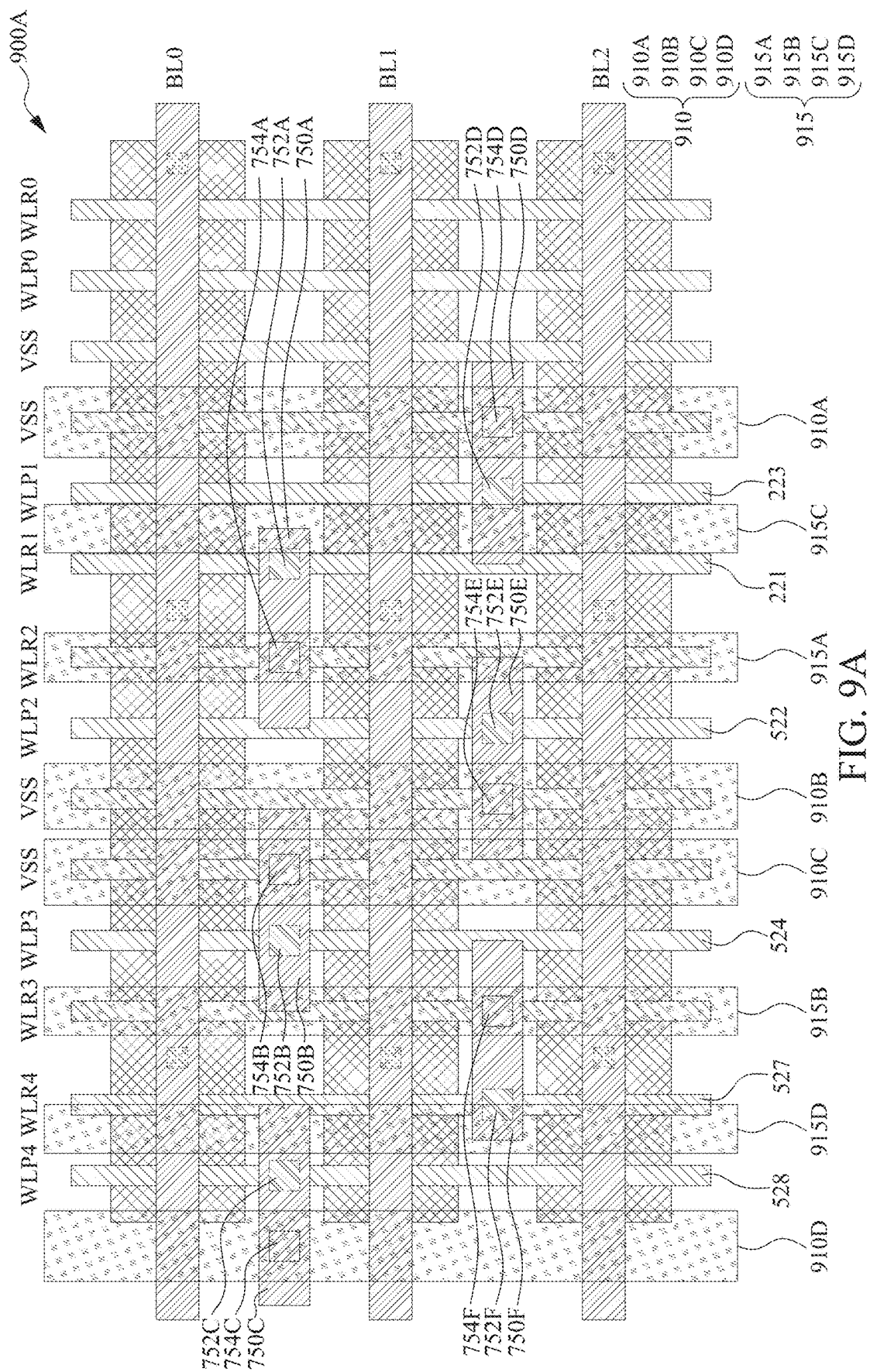
FIG. 9A is a top view of a schematic diagram of a layout structure of the anti-fuse memory array of FIG. 6, in accordance with various embodiments of the present disclosure.

In some embodiments, layout structure 700A further includes metal segments 750, vias 752 and vias 754. In some embodiments, metal segments 750 include one or more of metal segments 750A, 750B, . . . , 750F. In some embodiments, vias 752 include one or more of vias 752A, 752B, . . . , 752F. In some embodiments, vias 754 include one or more of vias 754A, 754B, . . . , 754F. Metal segments 750 are configured to couple the aforementioned gates to corresponding word lines (discussed below in FIG. 9A). In some embodiments, the respective gates are coupled through vias 752 to the metal segments 750, and the metal segments 750 are coupled through vias 754 to the corresponding word lines as illustrated in FIG. 9A. In some embodiments, the vias 752 are disposed at the same level as each other. In some embodiments, each via 752 is disposed between the corresponding gate (or dummy gate) and the corresponding metal segment 750 in a top-down sequence, and is also referred to as "VG" via. In some embodiments, vias 754 are disposed at the same level as each other. In some embodiments, each via 754 is disposed between the corresponding metal segment 750 and the corresponding word line WL in a top-down sequence, and is also referred to as "VO" via. In some embodiments, vias 754 are above vias 752, and vias 752 are above vias 330. In some embodiments, the metal segments 750 and the metal lines 320, 705, 715 are disposed at the same metal layer (e.g., M0). In some embodiments, the metal segments 750 and the metal lines 320, 705, 715 include the same material which includes, for example, titanium (Ti), aluminum (Al), copper (Cu), or the like.

In FIG. 7A, the metal segments 750A-750C are separate from each other and arranged in between the metal lines 320 and 705. The metal segments 750D-750F are separate from each other and arranged in between the metal lines 705 and 715. The gate 221 is coupled through the via 752A to the metal segment 750A, and the metal segment 750A is coupled through the via 754A to the corresponding word line WLR1 (FIG. 9A). The gate 524 is coupled through the via 752B to the metal segment 750B, and the metal segment 750B is coupled through the via 754B to the corresponding word line WLP3 (FIG. 9A). The gate 528 is coupled through the via 752C to the metal segment 750C, and the metal segment 750C is coupled through the via 754C to the corresponding word line WLP4 (FIG. 9A). The gate 223 is coupled through the via 752D to the metal segment 750D, and the metal segment 750D is coupled through the via 754D to the corresponding word line WLP1 (FIG. 9A). The gate 522 is coupled through the via 752E to the metal segment 750E, and the metal segment 750E is coupled through the via 754E to the corresponding word line WLP2 (FIG. 9A). The gate 527 is coupled through the via 752F to the metal segment 750F, and the metal segment 750F is coupled through the via 754F to the corresponding word line WLR4 (FIG. 9A).

By having the metal segments 750 positioned between the active regions 300, 702, and 710, additional metal layers located above, for example, metal layer M0, to couple the gates to the corresponding word lines, are not utilized since gates 221, 524, 528, 223, 522, 527, as discussed above, are to be coupled to the corresponding word lines through the metal segments 750, resulting in less manufacturing processes and simpler processes, compared to some approaches.

The numbers of the active regions, the metal lines as the bit lines, and the metal segments between the metal lines, as shown in FIG. 7A, are for illustrative purposes. Corresponding to the circuit configuration as shown in FIG. 6, other active regions, metal lines, and metal segments are not shown and detailed herein, for simplicity of illustration. Other numbers of one or ore more the active regions, the metal lines as the bit lines, or the metal segments are within the contemplated scope of the present disclosure.

Figure 7B:
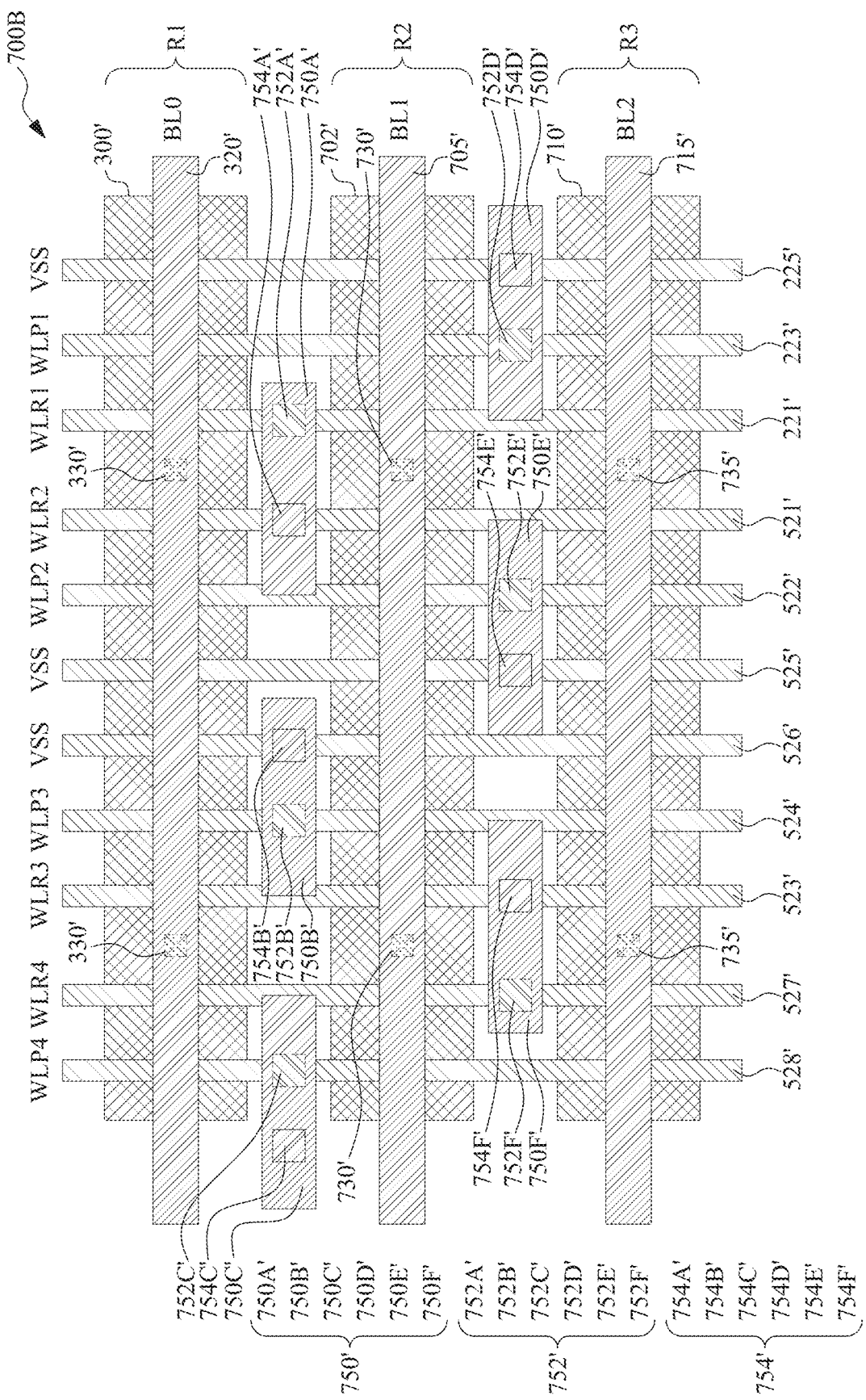
FIG. 7B is a diagram of a layout design, in accordance with some embodiments.

FIG. 7B is a diagram of a layout design 700B of corresponding layout structure 700A, in accordance with some embodiments.

Layout design 700B is a layout design of anti-fuse memory array 600 of FIG. 6. Layout design 700B is usable to manufacture anti-fuse memory array 600 or layout structure 700A.

The layout design 700B of anti-fuse memory array 600 has a configuration similar to that of layout structure 700A of FIG. 7A, and similar detailed description is therefore omitted.

In some embodiments, layout design 700B is a variation of layout design 500C. In comparison with layout design 500C of FIG. 5C, layout design 700B further includes active region layout patterns 702' and 710', metal line layout patterns 705' and 715', metal segment layout patterns 750', via layout patterns 752' and via layout patterns 754'.

In some embodiments, active region layout patterns 702' and 710' are usable to manufacture corresponding active regions 702 and 710.

In some embodiments, metal line layout patterns 705' and 715' are usable to manufacture corresponding metal lines 705 and 715.

In some embodiments, metal segment layout patterns 750' are usable to manufacture corresponding metal segments 750. In some embodiments, metal segment layout patterns 750' include one or more of metal segment layout patterns 750A', 750B', . . . , 750F'. In some embodiments, metal segment layout patterns 750A', 750B', . . . , 750F' are usable to manufacture corresponding metal segments 750A, 750B, . . . , 750F.

In some embodiments, via layout patterns 752' are usable to manufacture corresponding vias 752. In some embodiments, via layout patterns 752' include one or more of via layout patterns 752A', 752B', . . . , 752F'. In some embodiments, via layout patterns 752A', 752B', . . . , 752F' are usable to manufacture corresponding vias 752A, 752B, . . . , 752F.

In some embodiments, via layout patterns 754' are usable to manufacture corresponding vias 754. In some embodiments, via layout patterns 754' include one or more of via layout patterns 754A', 754B', . . . , 754F'. In some embodiments, via layout patterns 754A', 754B', . . . , 754F' are usable to manufacture corresponding vias 754A, 754B, . . . , 754F. Other configurations or quantities of patterns in layout design 700B are within the scope of the present disclosure.

Figure 8A:
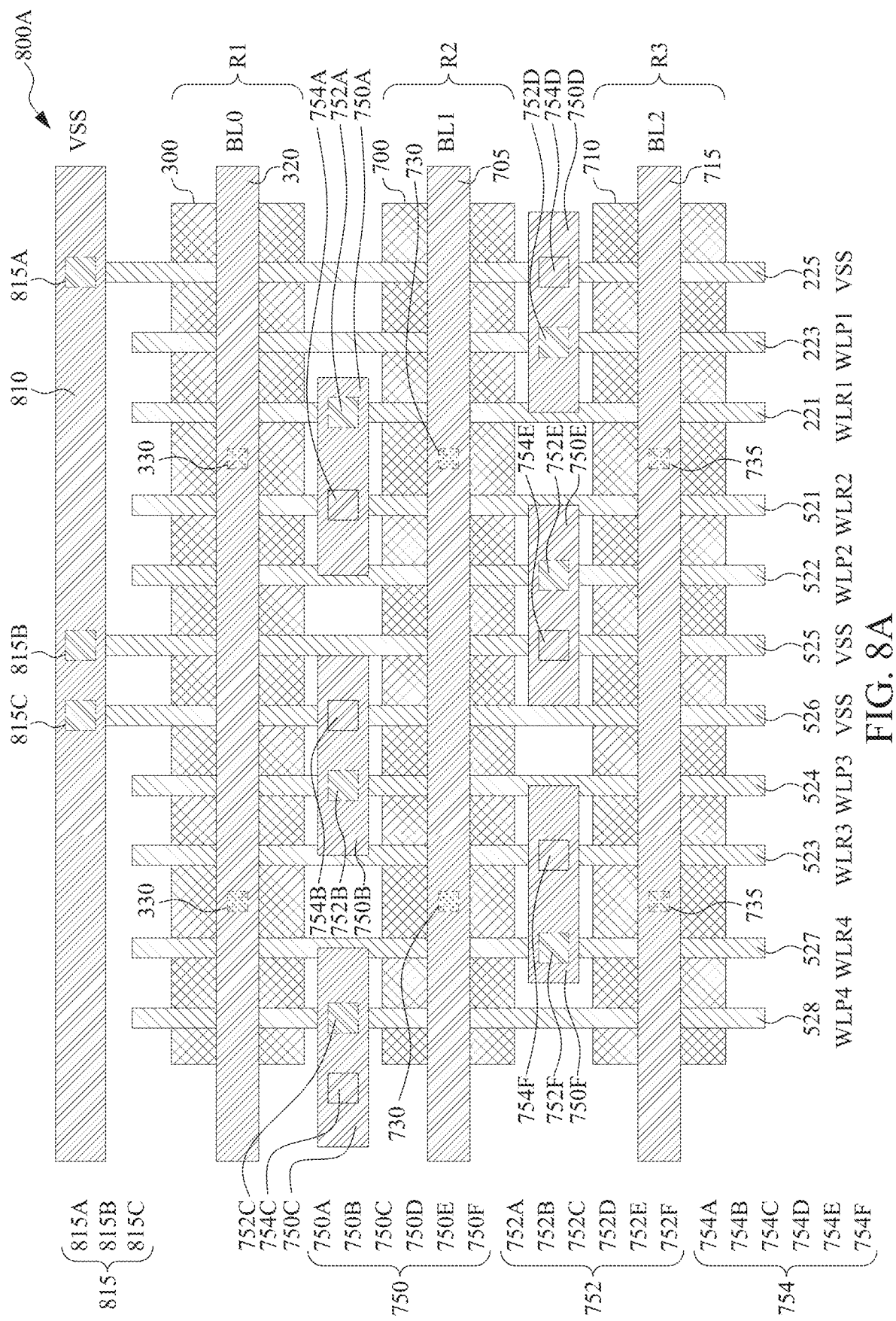
FIG. 8A is a top view of a schematic diagram of a layout structure of the anti-fuse memory array of FIG. 6, in accordance with various embodiments of the present disclosure.

FIG. 8A is a top view of a schematic diagram of a layout structure 800A of the anti-fuse memory array 600 of FIG. 6, in accordance with various embodiments of the present disclosure. In comparison to FIG. 7A, the layout structure 800A of FIG. 8A further includes a metal line 810 configured as the voltage line VSS, as discussed above. The metal line 810 is arranged over the dummy gates 225, 525, 526 and is coupled to the dummy gates 225, 525, 526 through vias 815. Vias 815 include one or more of vias 815A, 815B or 815C. The dummy gate 225 is coupled through the via 815A to the metal line 810. The dummy gate 525 is coupled through the via 815B to the metal line 810. The dummy gate 526 is coupled through the via 815C to the metal line 810. In some embodiments, the metal line 810 and the metal lines 320, 705, 715 are disposed at the same metal layer M0. In some embodiments, the metal line 810 and the metal lines 320, 705, 715 include the same material. With being disposed at the same metal layer M0 or including the same material, the metal line 810 and the metal lines 320, 705, 715 can be formed in the same process in some embodiments, resulting in less manufacturing processes and simpler processes, compared to some approaches.

Figure 8B:
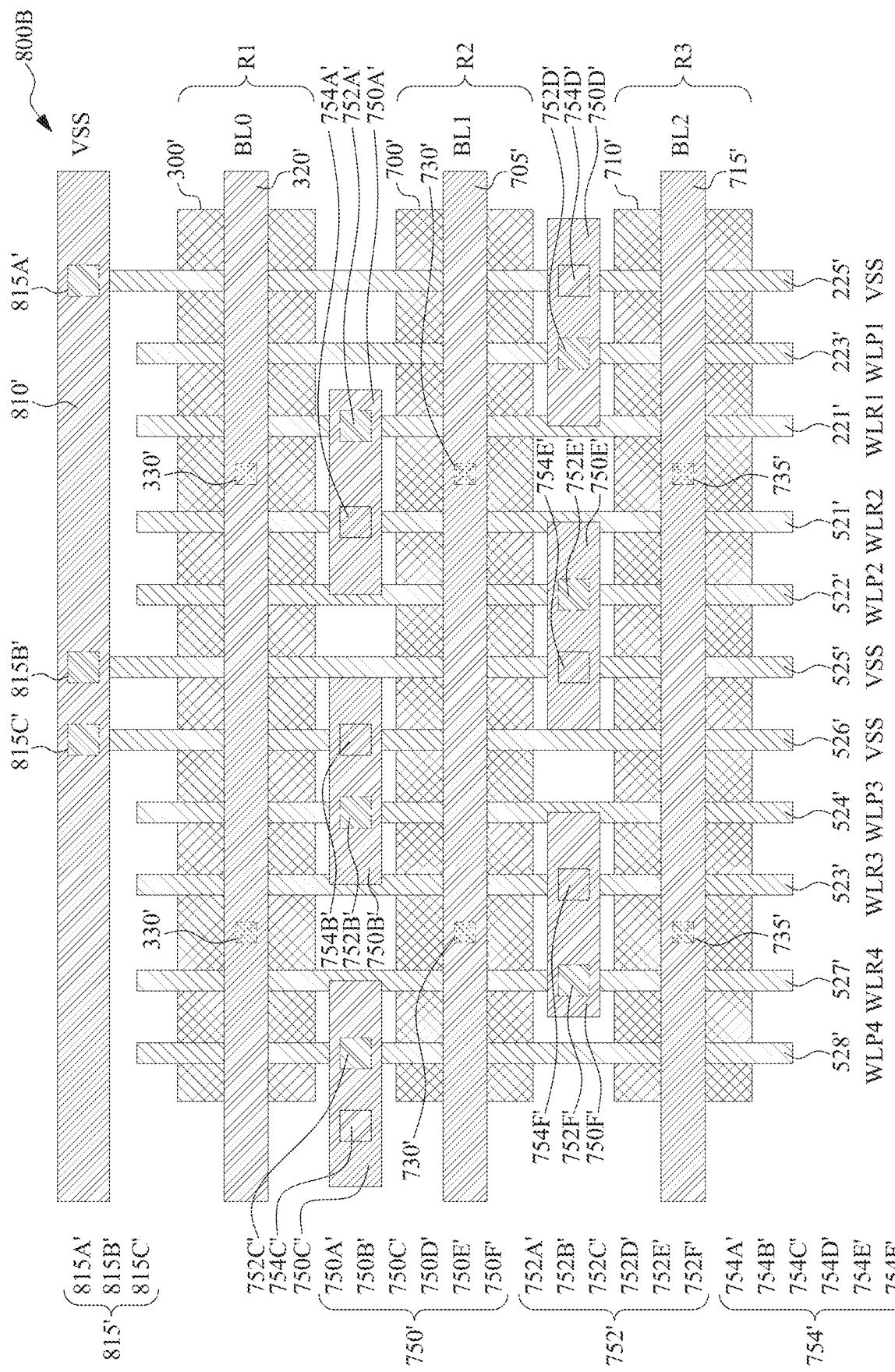
FIG. 8B is a diagram of a layout design, in accordance with some embodiments.

FIG. 8B is a diagram of a layout design 800B of corresponding layout structure 800A, in accordance with some embodiments.

Layout design 800B is a layout design of anti-fuse memory array 600 of FIG. 6. Layout design 800B is usable to manufacture anti-fuse memory array 600 or layout structure 800A.

The layout design 800B of memory cell 600 has a configuration similar to that of layout structure 800A of FIG. 8A, and similar detailed description is therefore omitted.

In some embodiments, layout design 800B is a variation of layout design 700B. In comparison with layout design 700B of FIG. 7B, layout design 800B further includes a metal line layout pattern 810' and via layout patterns 815'.

In some embodiments, metal line layout pattern 810' is usable to manufacture corresponding metal line 810.

In some embodiments, via layout patterns 815' are usable to manufacture corresponding vias 815. In some embodiments, via layout patterns 815' include one or more of via layout patterns 815A', 815B' or 815C'. In some embodiments, via layout patterns 815A', 815B' or 815C' are usable to manufacture corresponding vias 815A, 815B or 815C.

Other configurations or quantities of patterns in layout design 800B are within the scope of the present disclosure.

FIG. 9A is a top view of a schematic diagram of a layout structure 900A of the anti-fuse memory array 600 of FIG. 6, in accordance with various embodiments of the present disclosure. In comparison with FIG. 7A, layout structure 900A of FIG. 9A further includes metal lines 910 configured as the program word lines WLP as discussed above, and metal lines 915 configured as the read word lines WLR as discussed above. The metal lines 910 and 915 are arranged to cross over the metal lines 320, 705, 715. In some embodiments, the metal lines 910 and 915 are disposed at the same metal layer M1, which is above the metal layer M0 where the metal lines 320, 705, 715 are disposed. In some embodiments, the metal lines 910 and 915 are disposed at metal layers that are different from each other. Metal lines 910 include one or more of metal lines 910A, 910B, . . . , 910D. Metal lines 915 include one or more of metal lines 915A, 915B, . . . , 915D.

Exemplary connections between the gates and the corresponding program word lines are discussed hereinafter. The gate 223 is coupled through the via 752D to the metal segment 750D, and the metal segment 750D is coupled through the via 754D to the metal line 910A configured as the program word line WLP1. Alternatively stated, the gate 223 is coupled to the program word line WLP1. The gate 522 is coupled through the via 752E to the metal segment 750E, and the metal segment 750E is coupled through the via 754E to the metal line 910B configured as the program word line WLP2. Alternatively stated, the gate 522 is coupled to the program word line WLP2. The gate 524 is coupled through the via 752B to the metal segment 750B, and the metal segment 750B is coupled through the via 754B to the metal line 910C configured as the program word line WLP3. Alternatively stated, the gate 524 is coupled to the program word line WLP3. The gate 528 is coupled through the via 752C to the metal segment 750C, and the metal segment 750C is coupled through the via 754C to the metal line 910D configured as the program word line WLP4. Alternatively stated, the gate 528 is coupled to the program word line WLP4.

Exemplary connections between the gates and the corresponding read word lines are discussed hereinafter. The gate 221 is coupled through the via 752A to the metal segment 750A, and the metal segment 750A is coupled through the via 754A to the metal line 915A configured as the read word line WLR1. Alternatively stated, the gate 221 is coupled to the read word line WLR1. The gate 527 is coupled through the via 752F to the metal segment 750F, and the metal segment 750F is coupled through the via 754F to the metal line 915B configured as the read word line WLR4. Alternatively stated, the gate 527 is coupled to the read word line WLR4. The metal lines 915C and 915D are coupled through other metal segments (not shown) to other gates (not shown) that are not shown for simplicity of illustration. Accordingly, the connections between the metal lines 915C and 915D and the corresponding gates are not further described herein.

In some embodiments, the width of one or more of the metal lines 910 is the same as the width of one or more of the metal lines 915. To achieve various circuit characteristics, the width of one or more of the metal lines 910 configured as the program word lines WLP is larger than or smaller than the width of one or more of the metal lines 915 configured as the read word lines WLR. For example, reference is made to FIG. 10.

Figure 9B:
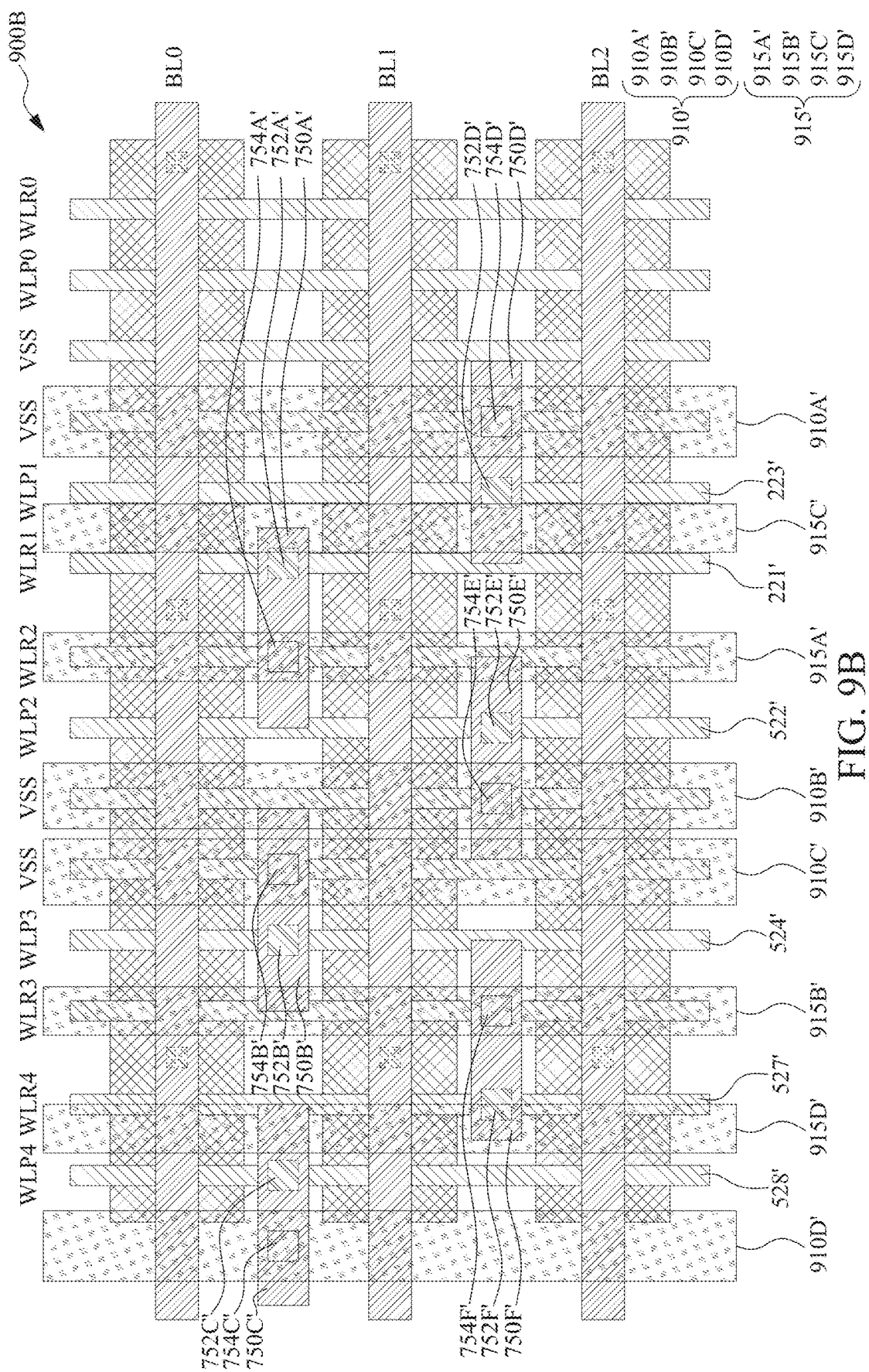
FIG. 9B is a diagram of a layout design, in accordance with some embodiments.

FIG. 9B is a diagram of a layout design 900B of corresponding layout structure 900A, in accordance with some embodiments.

Layout design 900B is a layout design of anti-fuse memory array 600 of FIG. 6. Layout design 900B is usable to manufacture anti-fuse memory array 600 or layout structure 900A.

The layout design 900B of anti-fuse memory array 600 has a configuration similar to that of layout structure 900A of FIG. 9A, and similar detailed description is therefore omitted.

In some embodiments, layout design 900B is a variation of layout design 700B. In comparison with layout design 700B of FIG. 7B, layout design 900B further includes metal line layout patterns 910' and 915'.

In some embodiments, metal line layout patterns 910' and 915' are usable to manufacture corresponding metal lines 910 and 915.

In some embodiments, metal line layout patterns 910' include one or more of metal line layout patterns 910A', 910B', . . . , 910D'. In some embodiments, metal line layout patterns 910A', 910B', . . . , 910D' are usable to manufacture corresponding metal lines 910A, 910B, . . . , 910D.

In some embodiments, metal line layout patterns 915' include one or more of metal line layout patterns 915A', 915B', . . . , 915D'. In some embodiments, metal line layout patterns 915A', 915B', . . . , 915D' are usable to manufacture corresponding metal lines 915A, 915B, . . . , 915D. Other configurations or quantities of patterns in layout design 900B are within the scope of the present disclosure.

Figure 10:
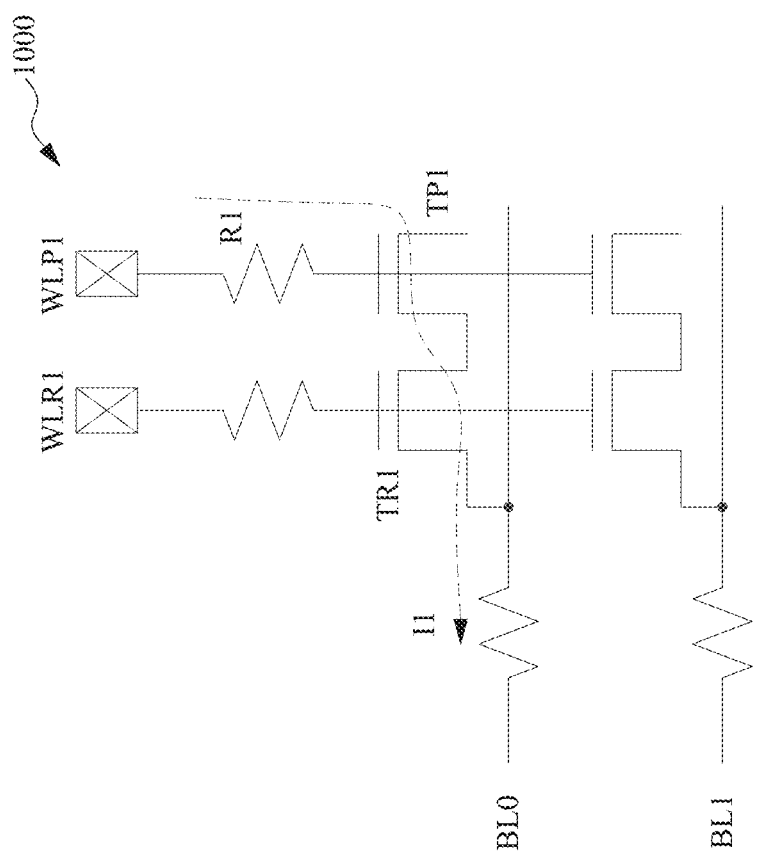
FIG. 10 is a schematic diagram of an equivalent circuit of a portion of the layout structure of FIG. 9A or the anti-fuse memory array of FIG. 6, in accordance with some embodiments of the present disclosure.

FIG. 10 is a schematic diagram of an equivalent circuit 1000 of a portion of layout structure 900A of FIG. 9A or the anti-fuse memory array 600 of FIG. 6, in accordance with some embodiments of the present disclosure. For example, FIG. 10 includes transistors TP1 and TR1 in row R1 and R2. In FIG. 10, the program word line WLP1 has a parasitic resistance R1 and is coupled to the gate terminal of the transistor TP1. In some embodiments, during a read operation, when the program word line WLP1 is applied with a voltage (for example, 1.8 volts), a read current I1 flowing through the parasitic resistance R1 and the transistor TP1 is generated accordingly. With the applied voltage being constant, when the parasitic resistance R1 of the program word line WLP1 decreases, the read current I1 increases, thus improving and enhancing the read operation. Accordingly, as illustrated in FIG. 9A, when the width of the metal line 910 as the program word line WLP1 is, for example, larger than the width of the metal line 915 as the read word line WLR1, then the parasitic resistance R1 of the program word line WLP1 is relatively reduced, compared to the condition of the metal lines 910 and 915 having the same width. With the parasitic resistance R1 being reduced, the read current I1 as discussed above is increased thus improving and enhancing the read operation. Therefore, in some embodiments, the read operation is improved when the width of the metal line 910, configured as the program word line WLP1, is larger than the width of the metal line 915, configured as the read word line WLR1.

In some embodiments at least one of the metal lines 910, configured as the program word lines WLP, has a corresponding area greater than or smaller than a corresponding area of at least one of the metal lines 915, configured as the read word lines WLR.

Figure 11A:
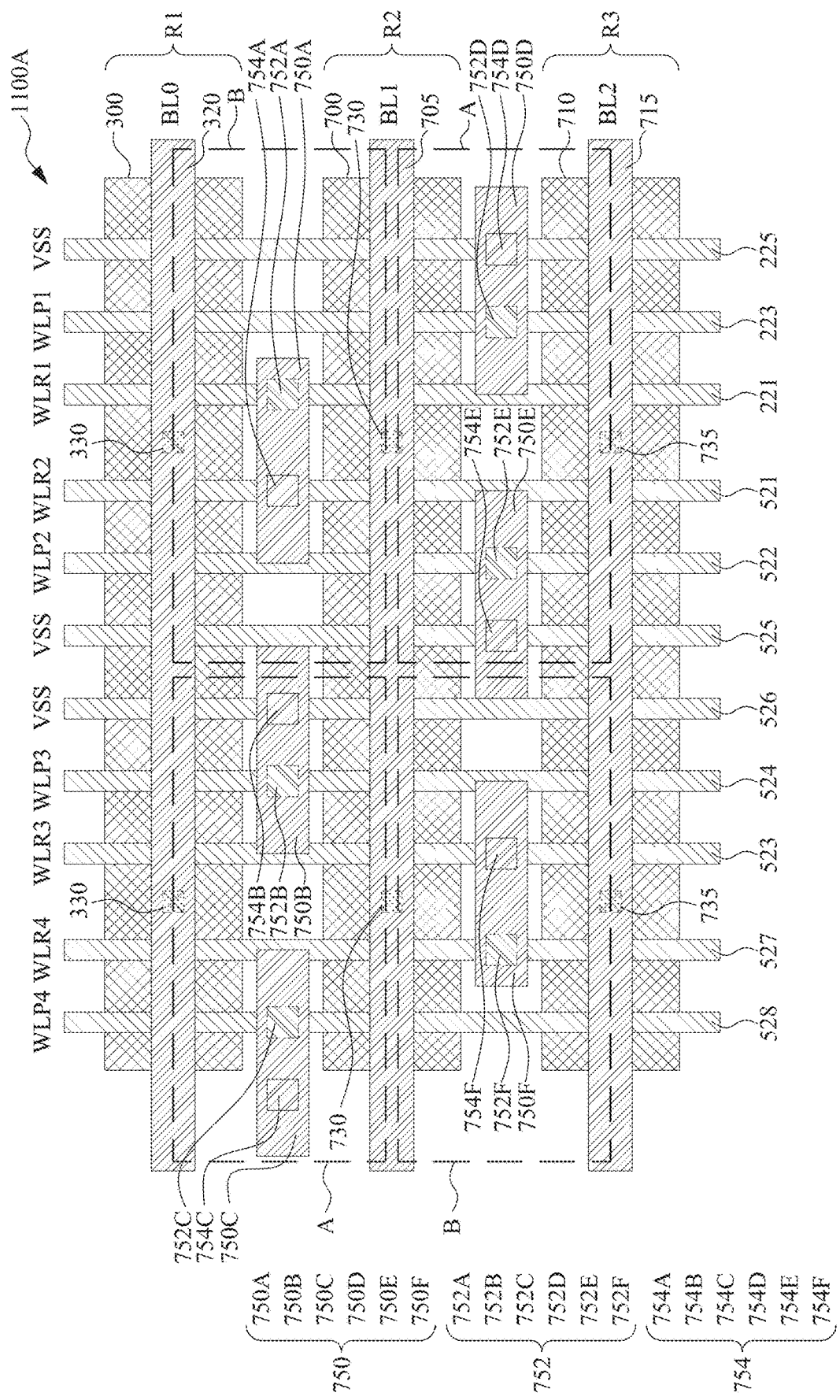
FIG. 11A is a top view of a schematic diagram of a layout structure of the anti-fuse memory array of FIG. 6, with layout cells, in accordance with some embodiments of the present disclosure.

FIG. 11A is a top view of a schematic diagram of a layout structure 1100A of the anti-fuse memory array 600 of FIG.

6, with layout cells A or B, in accordance with some embodiments of the present disclosure. For example, layout structure 1100A is layout structure 700A of FIG. 7A with labelled layout cells A or B. In some embodiments, layout cells A or B refer to either a corresponding layout structure or a corresponding layout design. For example, in FIG. 11A, layout cells A and B refers to corresponding structural elements. For example, in FIG. 11C, layout cells A and B refers to corresponding layout patterns.

In some embodiments, a layout cell denoted with an "A" includes two metal segments 750 coupled to the corresponding program word lines WLP and a layout cell denoted with a "B" includes one metal segment 750 coupled to the corresponding read word line WLR. As shown in FIG. 11A, the lower right layout cell "A" includes two metal segments 750 coupled to the program word lines WLP1 and WLP2 as discussed above, and the upper left layout cell "A" includes two metal segments 750 coupled to the program word lines WLP3 and WLP4 as discussed above. On the other hand, the upper right layout cell "B" includes one metal segment 750 coupled to the read word line WLR1 as discussed above, and the lower left layout cell "B" includes one metal segment 750 coupled to the read word line WLR4 as discussed above.

Figure 11B:
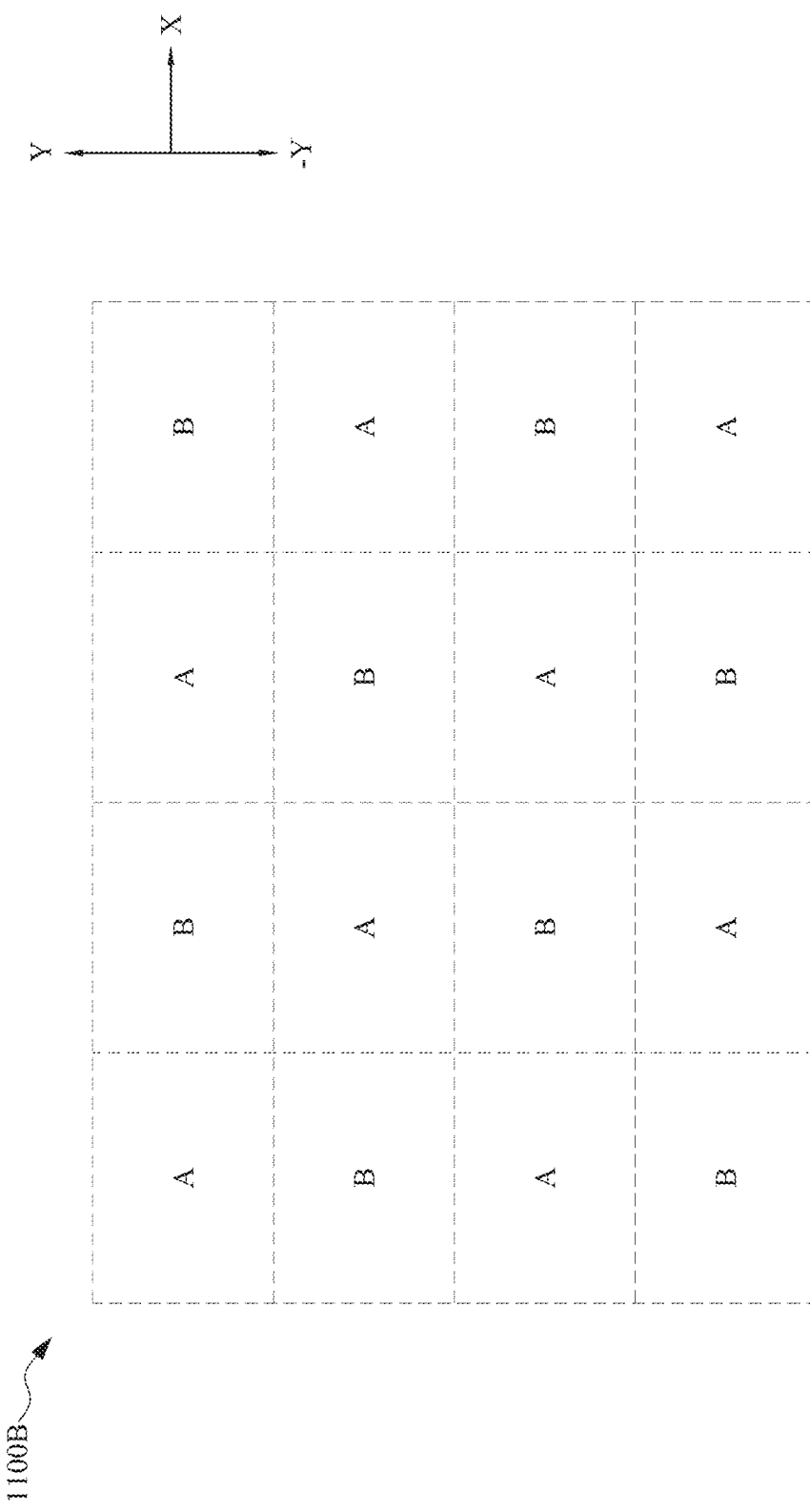
FIG. 11B is a top view of a schematic diagram of a layout of layout cells of FIG. 11A, in accordance with some embodiments of the present disclosure.
Figure 11C:
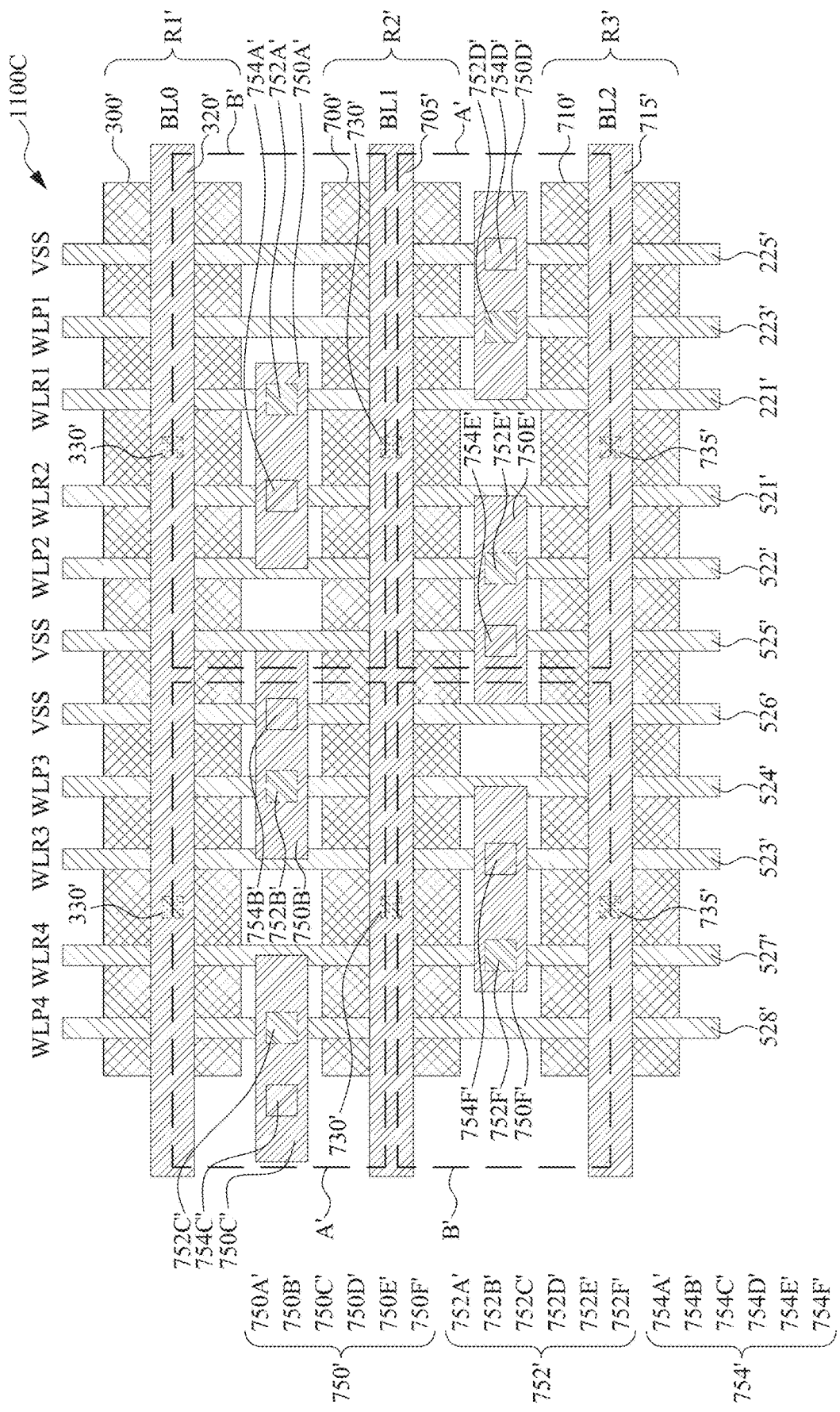
FIG. 11C is a layout design of the anti-fuse memory array of FIG. 6, in accordance with some embodiments of the present disclosure.

FIG. 11B is a top view of a schematic diagram of a layout structure 1100B of layout cells A or B of FIG. 11A, in accordance with some embodiments of the present disclosure. Layout structure 1100A can be configured to have a sequence of layout cells A or B from left to right or top to bottom as shown in layout structure 1100B, in accordance with some embodiments. In layout structure 1100B, in a left-to-right direction (e.g., x-direction) layout cells are arranged in a "ABAB" sequence. In layout structure 1100B, in a top-to-bottom direction (e.g., negative y-direction) layout cells are arranged in a "ABAB" sequence. Layout structure 1100B includes an array of 4 by 4 cells. In some embodiments, layout structure 1100B includes an array of cells different from a 4 by 4 array of cells. With the arrangement of the layout structure 1100B in FIG. 11B, layout cells A and B are uniformly arranged, resulting in area optimization of the layout structure 1100B.

FIG. 11C is a layout design 1100C of the anti-fuse memory array 600 of FIG. 6, with layout cells A or B, in accordance with some embodiments of the present disclosure. For example, layout design 1100C is layout design 700B of FIG. 7B with labelled layout cells A or B.

In some embodiments, a layout cell denoted with an "A" includes two metal segment layout patterns 750' over the corresponding program word lines WLP' and a layout cell denoted with a "B" includes one metal segment layout pattern 750' over the corresponding read word line WLR. As shown in FIG. 11A, the lower right layout cell "A" includes two metal segment layout patterns 750' over the program word lines WLP1 and WLP2 as discussed above, and the upper left layout cell "A" includes two metal segment layout patterns 750' over the program word lines WLP3 and WLP4 as discussed above. On the other hand, the upper right layout cell "B" includes one metal segment layout pattern 750' over the read word line WLR1 as discussed above, and the lower left layout cell "B" includes one metal segment layout pattern 750' over the read word line WLR4 as discussed above.

Figure 12A:
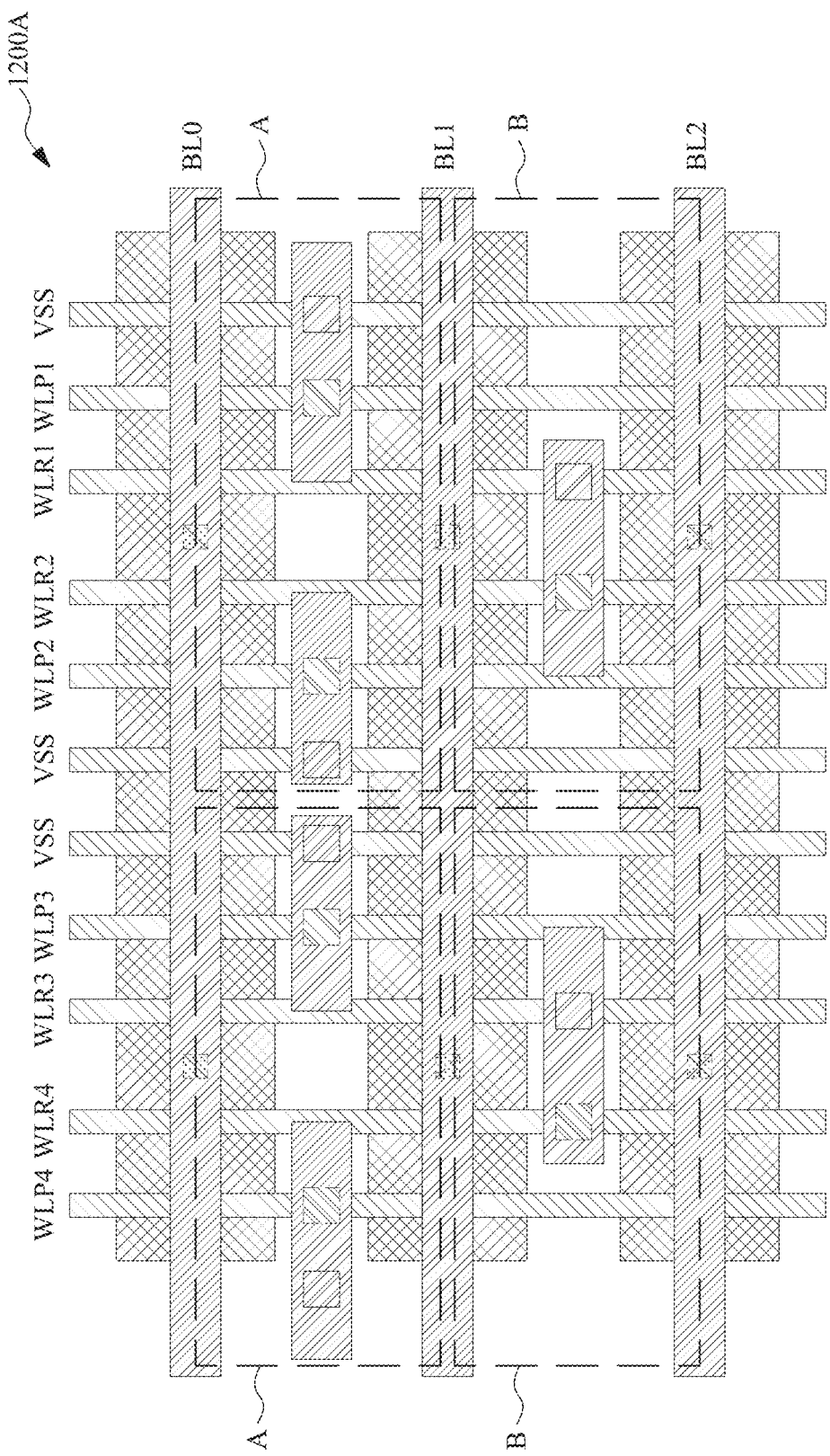
FIG. 12A is a top view of a schematic diagram of a layout, in accordance with various embodiments of the present disclosure.

FIG. 12A is a top view of a schematic diagram of a layout 1200A, in accordance with various embodiments of the present disclosure. For example, in some embodiments, layouts 1200A-1200B of FIGS. 12A-12B correspond to a schematic diagram of a layout structure which is a variation of layout structure 11A. For example, in some embodiments, layouts 1200A-1200B of FIGS. 12A-12B correspond to a schematic diagram of a layout design 1200A which is a variation of layout design 1100C. In comparison with FIG. 11A, the upper right layout cell of layout structure or layout design 1200A is the layout cell "A" and is coupled to the program word lines WLP1 and WLP2, and the lower right layout cell is the layout cell "B" coupled to the read word line WLR2. Layout structure or layout design 1200A also includes another layout cell "B" arranged on the lower left side and another layout cell "A" arranged on the upper left side. Accordingly, layout cells of layout structure or layout design 1200A of FIG. 12A are arranged in a "AABB" sequence in a left-to-right direction (e.g., x-direction).

FIG. 12B is a top view of a schematic diagram of a layout 1200B of layout cells A or B of FIG. 12A, in accordance with some embodiments of the present disclosure. Layout 1200A can be configured to have a sequence of layout cells A or B from left to right or top to bottom as shown in layout 1200B, in accordance with some embodiments. In layout 1200B, in a left-to-right direction (e.g., x-direction) layout cells are arranged in a "AABB" sequence. In layout 1200B, in a top-to-bottom direction (e.g., negative y-direction) layout cells are arranged in a "ABAB" sequence. Layout 1200B includes an array of 4 by 4 cells. In some embodiments, layout 1200B includes an array of cells different from a 4 by 4 array of cells.

Figure 13A:
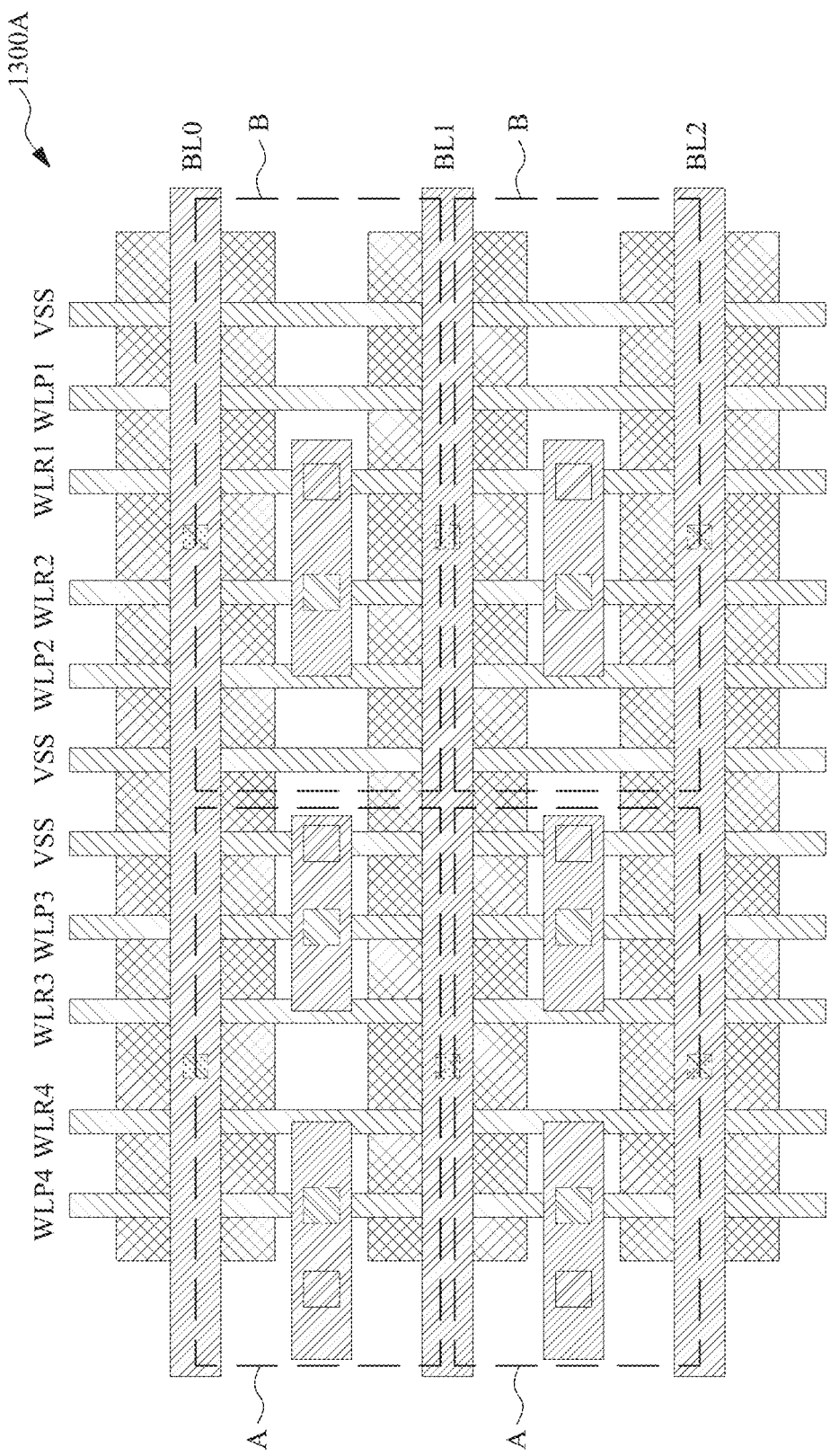
FIG. 13A is a top view of a schematic diagram of a layout, in accordance with various embodiments of the present disclosure.

FIG. 13A is a top view of a schematic diagram of a layout 1300A of a variation of anti-fuse memory array 600 of FIG. 6 with layout cells A or B, in accordance with various embodiments of the present disclosure. For example, in some embodiments, layouts 1300A-1300B of FIGS. 13A-13B correspond to a schematic diagram of a layout structure which is a variation of layout structure 1100A. For example, in some embodiments, layouts 1300A-1300B of FIGS. 13A-13B correspond to a schematic diagram of a layout design which is a variation of layout design 1100C. In comparison with FIG. 11A, the lower left layout cell is the layout cell "A" coupled to the program word lines WLP3 and WLP4, and the lower right layout cell is the layout cell "B" coupled to the read word line WLR2. Layout design 1300A also includes another layout cell "B" arranged on the upper right side, and includes another layout cell "A" arranged on upper left side. Accordingly, layout cells of layout 1300A of FIG. 13A, arranged in a top-to-bottom sequence of arrangements, are referred to as being arranged as "AABB."

FIG. 13B is a top view of a schematic diagram of a layout 1300B of layout cells A or B of FIG. 13A, in accordance with some embodiments of the present disclosure. Layout 1300A can be configured to have a sequence of layout cells A or B from left to right or top to bottom as shown in layout 1300B, in accordance with some embodiments. In layout 1300B, in a left-to-right direction (e.g., x-direction) layout cells are arranged in a "ABAB" sequence. In layout 1300B, in a top-to-bottom direction (e.g., negative y-direction) layout cells are arranged in a "AABB" sequence. Layout 1300B includes an array of 4 by 4 cells. In some embodiments, layout 1300B includes an array of cells different from a 4 by 4 array of cells.

The configurations of the layout cells "A" and "B" as discussed above are given for illustrative purposes. Various configurations of the layout cells "A" and "B" are within the contemplated scope of the present disclosure. For example, in various embodiments, the layout cell "A" includes only one metal segment 750 coupled to the corresponding program word line WLP, and the layout unit "B" includes only one metal segment 750 coupled to the corresponding read word line WLR.

Figure 14:
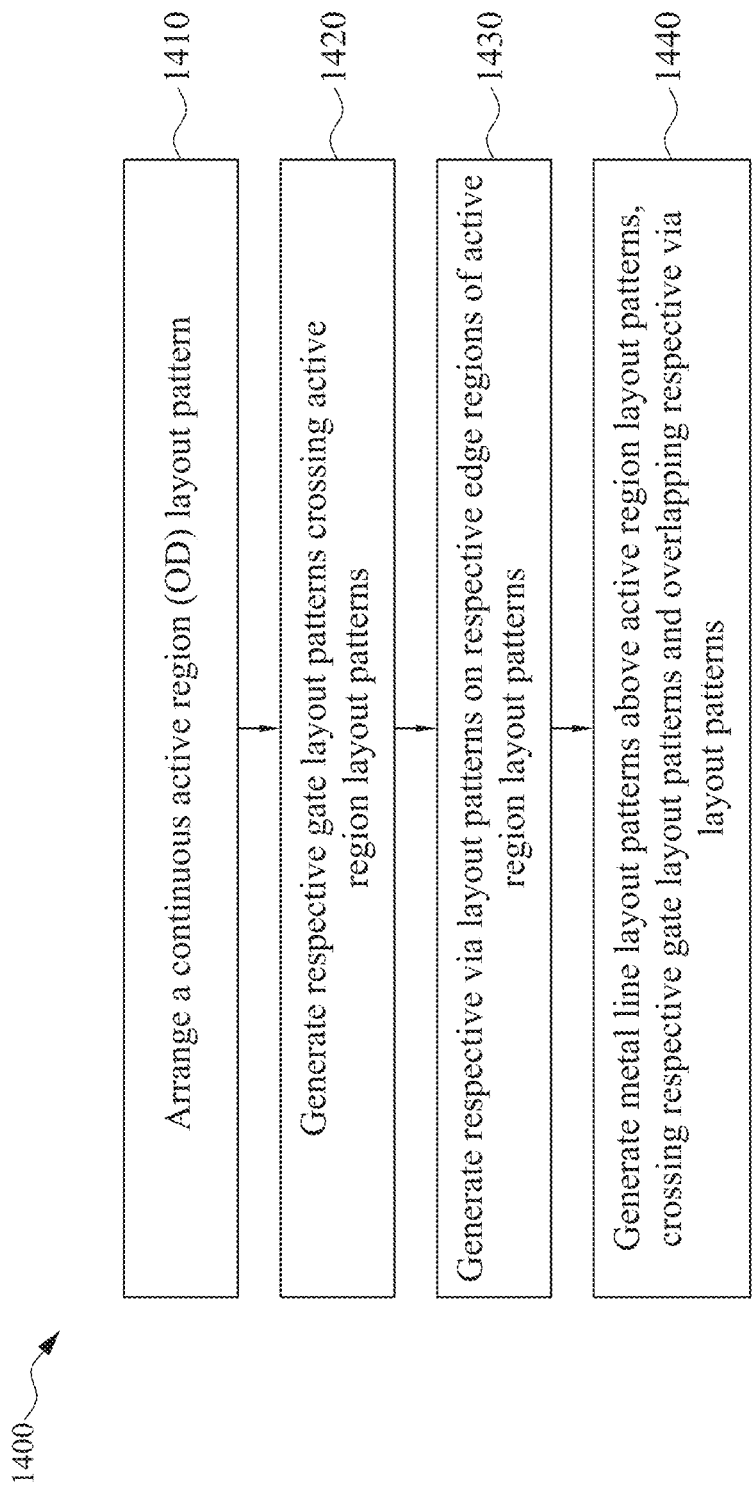
FIG. 14 is a flowchart of a method of generating a layout diagram of an IC device, in accordance with some embodiments.

FIG. 14 is a flowchart of a method 1400 of generating a layout diagram of an IC device, in accordance with some embodiments. In some embodiments, the method 1400 is performed to generate layouts including the layouts of the embodiments as discussed above. For example, in some embodiments method 1400 is configured to generate one or more of layout designs 200D of FIG. 2D, layout design 300C of FIG. 3C, layout design 400C of FIG. 4C, layout design 500C of FIG. 5C, layout design 700B of FIG. 7B, layout design 800B of FIG. 8B, layout design 900B of FIG. 9B, layout design 1100C of FIG. 11C, layout 1200A of FIG. 12A or layout design 1300A of FIG. 13A.

For simplicity, the method 1400 is explained below with reference to the layout structure 200B of FIG. 2B, but is not limited thereto.

In some embodiments, some or all of method 1400 is executed by a processor of a computer. In some embodiments, some or all of method 1400 is executed by a processor 1502 of an IC device design system 1500, discussed below with respect to FIG. 15.

Some or all of the operations of method 1400 are capable of being performed as part of a design procedure performed in a design house, e.g., a design house 1620 discussed below with respect to FIG. 16.

In some embodiments, the operations of method 1400 are performed in the order depicted in FIG. 14. In some embodiments, the operations of method 1400 are performed in an order other than the order depicted in FIG. 14. In some embodiments, one or more operations are performed before, between, during, and/or after performing one or more operations of method 1400.

In operation 1410, a continuous active region (OD) layout pattern 300' is arranged. For example, in FIG. 2D, the active region (OD) layout pattern 300' is arranged and continuously extends in, for example, X-direction.

In operation 1420, respective gate layout patterns are generated crossing the active region (OD). For example, in FIG. 2D, the gate layout patterns 211', 213', 221', and 223' and dummy gate layout patterns 215' and 225' are generated and separated from each other, and extend in, for example, Y direction to cross over or overlap the active region layout pattern 300'. As a result, the active region layout pattern 300' includes the region layout patterns 301'-307' arranged on opposite sides of the gate layout patterns 211', 213', 221', 223' and the dummy gate layout patterns 215', 225', as discussed above.

In operation 1430, respective via layout patterns are generated on respective edge regions of the active region layout pattern. For example, in FIG. 2D, the via layout patterns 330' are generated on the region layout patterns 301' and 307' between the active region layout pattern 300' and the bit line BL layout pattern.

In operation 1440, a metal line layout pattern is generated above the active region layout pattern, crossing the respective gate layout patterns and overlapping the respective via layout patterns. For example, in FIG. 2D, the metal line layout pattern 320' is generated above the active region layout pattern 300', and extends in the X direction to cross over the gate layout patterns 211', 213', 221', 223' and the dummy gate layout patterns 215', 225', and to overlap the via layout patterns 330'. In connection, the metal line layout pattern 320' a bit line BL layout pattern.

The operations of the method 1400 as illustrated above are exemplarily discussed with reference to the layout design 200D of FIG. 2D. The operations of method 1400 are provided for illustrative purposes, and are also applicable to generating other layout designs having similar corresponding layout structures of the embodiments as discussed above. In various embodiments, the method 1400 further includes additional operations of generating corresponding layout design portions of the corresponding layout structures 300B, 400B, 500B, 700A, 800A, 900A, 1100A, 1200A, and 1300A, as discussed above. For example, method 1400 further includes the operations of arranging multiple continuous active region layout patterns (e.g., 300', 702', 710' of layout design 700B of FIG. 7B) useable to manufacture corresponding continuous active regions (e.g., 300, 702, 710 of FIG. 7A), generating multiple metal segment layout patterns (e.g., 750' of FIG. 7B) usable to manufacture corresponding multiple metal segment layout patterns (e.g., 750' of FIG. 7B), and generating multiple metal line layout patterns (e.g., 320', 705', 715' in layout design 700B of FIG. 7B) as bit line layout pattern BL, in some embodiments. In some embodiments, multiple metal line layout patterns (e.g., 320', 705', 715' of layout design 700B of FIG. 7B) are usable to manufacture corresponding metal lines (e.g., 320, 705, 715 of FIG. 7A) as bit lines BL, as illustrated in the layout structure 700A of FIG. 7A.

In some embodiments, the method 1400 further includes operations of generating at least one voltage line layout pattern 810' or 815' (e.g., VSS of FIG. 8A), as illustrated in the layout structure 800A of FIG. 8A.

In some embodiments, method 1400 further includes the operations of generating metal line layout patterns 910' useable to manufacture corresponding metal lines 910 configured as the program word lines WLP, and generating metal line layout patterns 915' useable to manufacture corresponding metal lines 915 configured as the read word lines WLR, as illustrated in the layout structure 900A of FIG. 9A.

Figure 15:
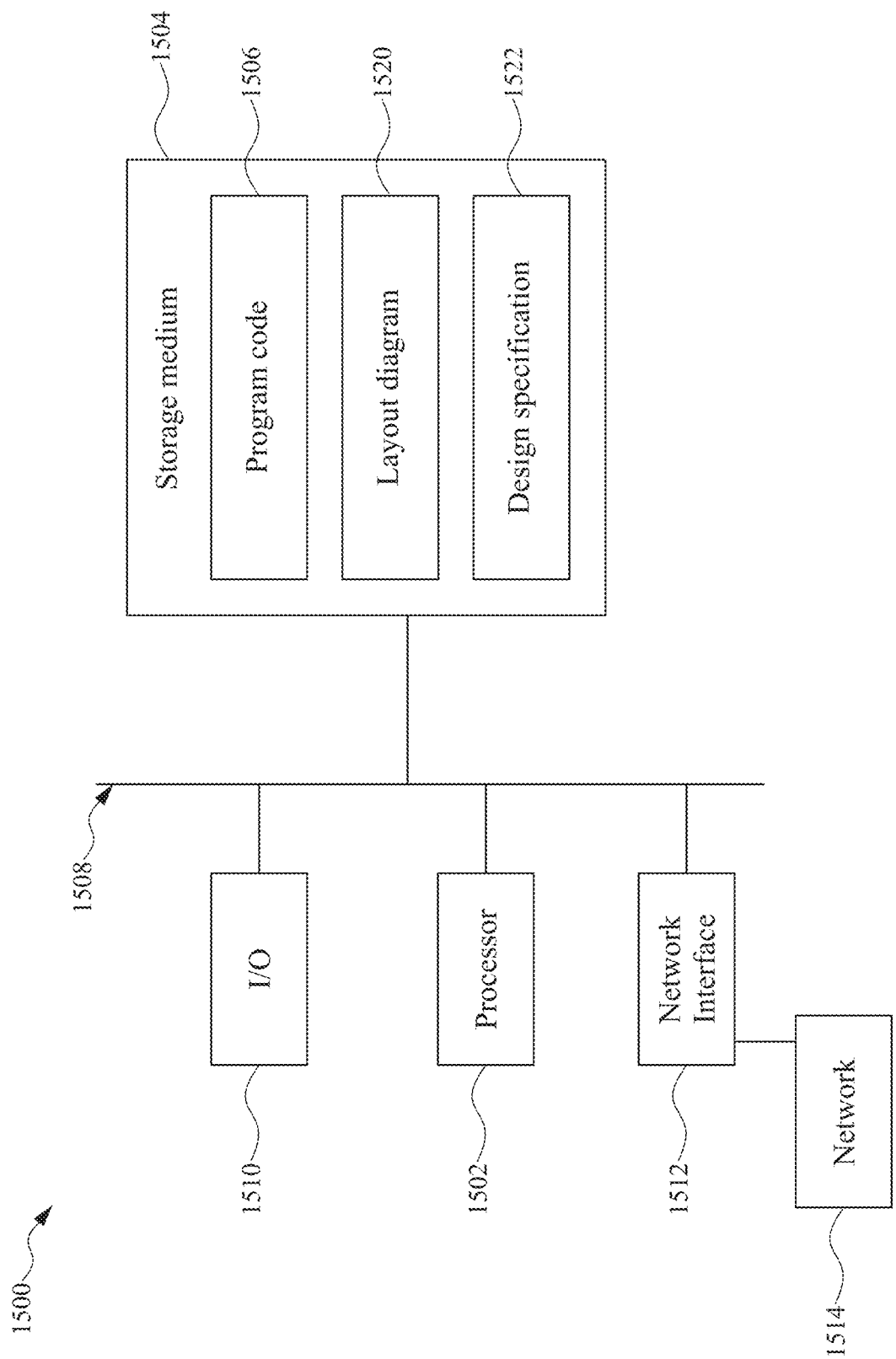
FIG. 15 is a block diagram of IC device design system, in accordance with some embodiments.

FIG. 15 is a block diagram of IC device design system 1500, in accordance with some embodiments. One or more operations of method 1400, discussed above with respect to FIG. 14, are implementable using IC device design system 1500, in accordance with some embodiments.

In some embodiments, IC device design system 1500 is a computing device including a hardware processor 1502 and a non-transitory computer-readable storage medium 1504. Non-transitory computer-readable storage medium 1504, amongst other things, is encoded with, i.e., stores, computer program code 1506, i.e., a set of executable instructions. Execution of computer program code 1506 by hardware processor 1502 represents (at least in part) an IC device design system which implements a portion or all of, e.g., a method 1400 discussed above with respect to FIG. 14 (hereinafter, the noted processes and/or methods).

Processor 1502 is electrically coupled to non-transitory computer-readable storage medium 1504 via a bus 1508. Processor 1502 is also electrically coupled to an I/O interface 1510 by bus 1508. A network interface 1512 is also electrically connected to processor 1502 via bus 1508. Network interface 1512 is connected to a network 1514, so that processor 1502 and non-transitory, computer-readable storage medium 1504 are capable of connecting to external elements via network 1514. Processor 1502 is configured to execute computer program code 1506 encoded in non-transitory computer-readable storage medium 1504 in order to cause IC device design system 1500 to be usable for performing a portion or all of the noted processes and/or methods. In one or more embodiments, processor 1502 is a central processing unit (CPU), a multi-processor, a distributed processing system, an application specific integrated circuit (ASIC), and/or a suitable processing unit.

In one or more embodiments, non-transitory computer-readable storage medium 1504 is an electronic, magnetic, optical, electromagnetic, infrared, and/or a semiconductor system (or apparatus or device). For example, non-transitory computer-readable storage medium 1504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 1504 includes a compact disk-read only memory (CD-ROM), a compact disk-read/write (CD-R/W), and/or a digital video disc (DVD).

In one or more embodiments, non-transitory computer-readable storage medium 1504 stores computer program code 1506 configured to cause IC device design system 1500 to be usable for performing a portion or all of the noted processes and/or method 1400. In one or more embodiments, non-transitory computer-readable storage medium 1504 also stores information which facilitates performing a portion or all of the noted processes and/or methods. In various embodiments, non-transitory computer-readable storage medium 1504 stores one or a combination of at least one IC layout diagram 1520 or at least one design specification 1522, each discussed above with respect to method 1400 and FIGS. 1-9B and 11A-13B, or at least one layout design useable to manufacture a corresponding layout structure 200B, 300B, 400B, 500B, 700A-900A, 1100A-1100B, 1200A-1200B or 1300A-1300B.

In some embodiments, non-transitory computer-readable storage medium 1504 stores instructions (e.g., computer program code 1506) for interfacing with manufacturing machines. The instructions (e.g., computer program code 1506) enable processor 1502 to generate manufacturing instructions readable by the manufacturing machines to effectively implement method 1400 during a manufacturing process.

IC device design system 1500 includes I/O interface 1510. I/O interface 1510 is coupled to external circuitry. In various embodiments, I/O interface 1510 includes one or a combination of a keyboard, keypad, mouse, trackball, trackpad, display, touchscreen, and/or cursor direction keys for communicating information and commands to and/or from processor 1502.

IC device design system 1500 also includes network interface 1512 coupled to processor 1502. Network interface 1512 allows system 1500 to communicate with network 1514, to which one or more other computer systems are connected. Network interface 1512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods is implemented in two or more systems 1500.

IC device design system 1500 is configured to receive information through I/O interface 1510. The information received through I/O interface 1510 includes one or a combination of at least one design rule instructions, at least one set of criteria, at least one design rule, at least one DRM, and/or other parameters for processing by processor 1502. The information is transferred to processor 1502 via bus 1508. IC device design system 1500 is configured to transmit and/or receive information related to a user interface through I/O interface 1510.

In some embodiments, a portion or all of the noted processes and/or method 1400 is implemented as a standalone software application for execution by a processor. In some embodiments, a portion or all of the noted processes and/or method 1400 is implemented as a software application that is a part of an additional software application. In some embodiments, a portion or all of the noted processes and/or method 1400 is implemented as a plug-in to a software application. In some embodiments, at least one of the noted processes and/or method 1400 is implemented as a software application that is a portion of an EDA tool. In some embodiments, an IC layout diagram or layout design is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of method 1400, as discussed above with respect to FIGS. 1-9B and 11A-13B, IC device design system 1500 enables the benefits discussed above with respect to method 1400.

Figure 16:
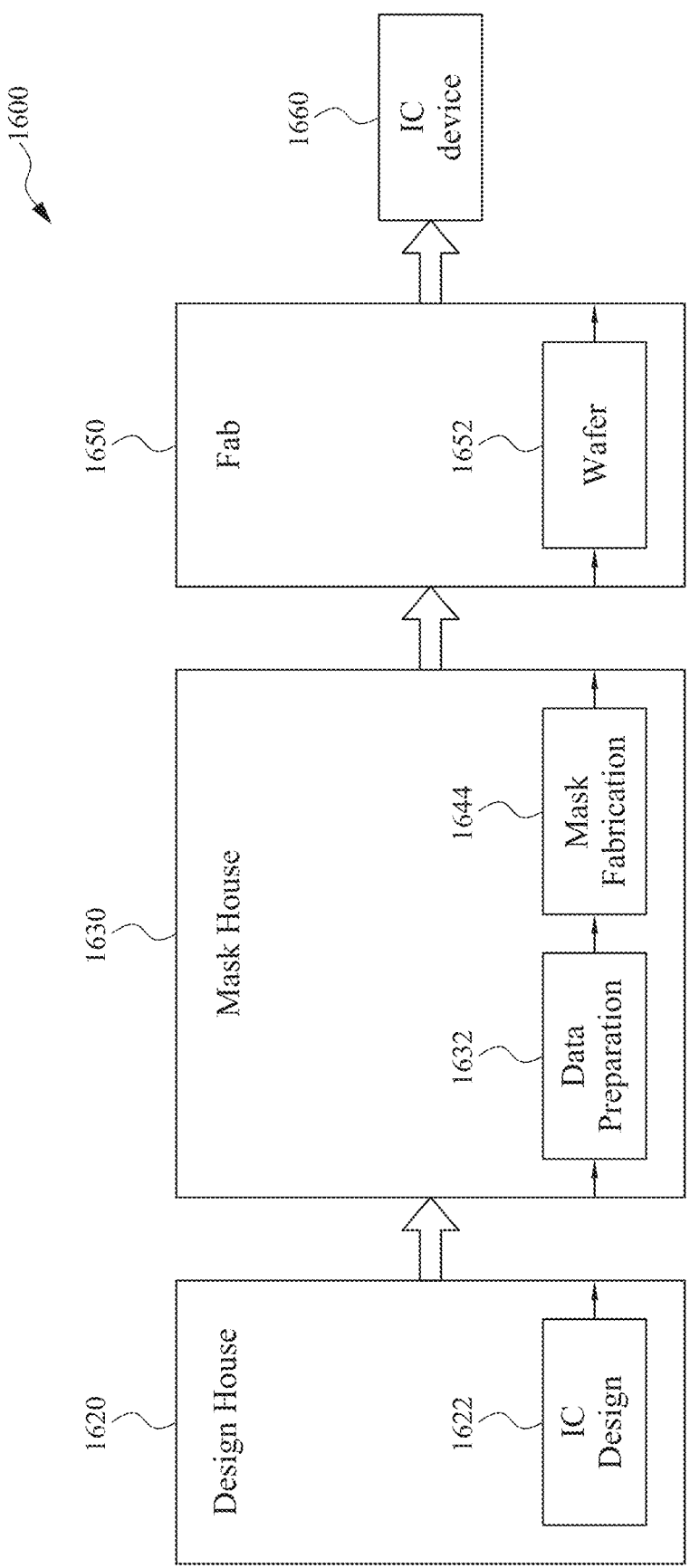
FIG. 16 is a block diagram of IC manufacturing system, and an IC manufacturing flow associated therewith, in accordance with some embodiments.

FIG. 16 is a block diagram of IC manufacturing system 1600, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1600.

In FIG. 16, IC manufacturing system 1600 includes entities, such as a design house 1620, a mask house 1630, and an IC manufacturer/fabricator ("fab") 1650, that interact with one another in the design, development, and manufacturing cycles and/or services related to manufacturing an IC device 1660. The entities in system 1600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1620, mask house 1630, and IC fab 1650 is owned by a single larger company. In some embodiments, two or more of design house 1620, mask house 1630, and IC fab 1650 coexist in a common facility and use common resources.

Design house (or design team) 1620 generates an IC design layout diagram 1622 based on method 1400, discussed above with respect to FIGS. 1-9B and 11A-13B. IC design layout 1622 includes various geometrical patterns that correspond to patterns of metal, oxide, or semiconductor layers that make up the various components of IC device 1660 to be fabricated. The various layers combine to form various IC features. For example, a portion of IC design layout 1622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1620 implements a proper design procedure including method 1400, discussed above with respect to FIGS. 1-9B and 11A-13B, to form IC design layout 1622. The design procedure includes one or more of logic design, physical design or place and route. IC design layout 1622 is presented in one or more data files having information of the geometrical patterns. For example, IC design layout 1622 can be expressed in a GDSII file format or DFII file format.

Mask house 1630 includes data preparation 1632 and mask fabrication 1644. Mask house 1630 uses IC design layout 1622 to manufacture one or more masks to be used for fabricating the various layers of IC device 1660 according to IC design layout 1622. Mask house 1630 performs mask data preparation 1632, where IC design layout 1622 is translated into a representative data file ("RDF"). Mask data preparation 1632 provides the RDF to mask fabrication 1644. Mask fabrication 1644 includes a mask writer. A mask writer converts the RDF to an image on a substrate, such as a mask (reticle) or a semiconductor wafer 1652. The design layout 1622 is manipulated by mask data preparation 1632 to comply with particular characteristics of the mask writer and/or requirements of IC fab 1650. In FIG. 16, mask data preparation 1632 and mask fabrication 1644 are illustrated as separate elements. In some embodiments, mask data preparation 1632 and mask fabrication 1644 can be collectively referred to as mask data preparation.

In some embodiments, mask data preparation 1632 includes optical proximity correction (OPC) which uses lithography enhancement techniques to compensate for image errors, such as those that can arise from diffraction, interference, other process effects and the like. OPC adjusts IC design layout 1622. In some embodiments, mask data preparation 1632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1632 includes a mask rule checker (MRC) that checks the IC design layout 1622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout 1622 to compensate for limitations during mask fabrication 1644, which may undo part of the modifications performed by OPC in order to meet mask creation rules.

In some embodiments, mask data preparation 1632 includes lithography process checking (LPC) that simulates processing that will be implemented by IC fab 1650 to fabricate IC device 1660. LPC simulates this processing based on IC design layout 1622 to create a simulated manufactured device, such as IC device 1660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1622.

It should be understood that the above description of mask data preparation 1632 has been simplified for the purposes of clarity. In some embodiments, data preparation 1632 includes additional features such as a logic operation (LOP) to modify the IC design layout 1622 according to manufacturing rules. Additionally, the processes applied to IC design layout 1622 during data preparation 1632 may be executed in a variety of different orders.

After mask data preparation 1632 and during mask fabrication 1644, a mask or a group of masks are fabricated based on the modified IC design layout 1622. In some embodiments, mask fabrication 1644 includes performing one or more lithographic exposures based on IC design layout 1622. In some embodiments, an electron-beam (e-beam) or a mechanism of multiple e-beams is used to form a pattern on a mask (photomask or reticle) based on the modified IC design layout 1622. Mask can be formed in various technologies. In some embodiments, mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask includes a transparent substrate (e.g., fused quartz) and an opaque material (e.g., chromium) coated in the opaque regions of the binary mask. In another example, mask is formed using a phase shift technology. In a phase shift mask (PSM) version of mask, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1644 is used in a variety of processes. For example, such a mask(s) is used in an ion implantation process to form various doped regions in semiconductor wafer 1652, in an etching process to form various etching regions in semiconductor wafer 1652, and/or in other suitable processes.

IC fab 1650 includes wafer fabrication. IC fab 1650 is an IC fabrication business that includes one or more manufacturing facilities for the fabrication of a variety of different IC products. In some embodiments, IC Fab 1650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1650 uses mask(s) fabricated by mask house 1630 to fabricate IC device 1660. Thus, IC fab 1650 at least indirectly uses IC design layout 1622 to fabricate IC device 1660. In some embodiments, semiconductor wafer 1652 is fabricated by IC fab 1650 using mask(s) to form IC device 1660. In some embodiments, the IC fabrication includes performing one or more lithographic exposures based at least indirectly on IC design layout 1622. Semiconductor wafer 1652 includes a silicon substrate or other proper substrate having material layers formed thereon. Semiconductor wafer 1652 further includes one or more of various doped regions, dielectric features, multilevel interconnects, and the like (formed at subsequent manufacturing steps).

Details regarding an IC manufacturing system (e.g., system 1600 of FIG. 16), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

The embodiments of the present disclosure have some advantageous features. For example, multiple memory cells each including a programing device and a reading device are able to be placed together with one continuous active region, in order to avoid design rule limitations of Design Rule Check (DRC). Accordingly, the space between different memory cells corresponding to the same bit line is not required. As a result, the area required for the memory cells is reduced.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a structure is disclosed, and the structure includes a first word line, a bit line, and an anti-fuse cell. The anti-fuse cell includes a first reading device, a first programming device, and a dummy device. The first reading device includes a first gate coupled to the first word line, a first source/drain region coupled to the bit line, and a second source/drain region. The first source/drain region and the second source/drain region are on opposite sides of the first gate. The first programming device includes a second gate, a third source/drain region coupled to the second source/drain region, and a fourth source/drain region. The third source/drain region and the fourth source/drain region are on opposite sides of the second gate. The dummy device includes a third gate, a fifth source/drain region coupled to the fourth source/drain region, and a sixth source/drain region. The fifth source/drain region and the sixth source/drain region are on opposite sides of the third gate.

In accordance with various embodiments, the structure further comprises a second programming device. The second programming device comprises a fourth gate and a seventh source/drain region on one side of the fourth gate. The first to seventh source/drain regions are included in a continuous active region including a semiconductor material.

In accordance with various embodiments, the dummy device further comprises a fifth gate, an eighth source/drain region coupled to the sixth source/drain region, and a ninth source/drain region coupled to the seventh source/drain region, wherein the eighth source/drain region and the ninth source/drain region are on opposite sides of the fifth gate.

In accordance with various embodiments, the structure further comprises a second word line, a second programming device, and a second reading device. The dummy device is coupled between the first programming device and the second programming device. The second programming device comprises a fourth gate, a seventh source/drain region, and an eighth source/drain region. The seventh source/drain region and the eighth source/drain region are on opposite sides of the fourth gate. The second reading device comprises a fifth gate coupled to the second word line, a ninth source/drain region coupled to the eighth source/drain region, and a tenth source/drain region coupled to the bit line, wherein the ninth source/drain region and the tenth source/drain region are on opposite sides of the fifth gate.

In accordance with various embodiments, the structure further comprises a second word line coupled to the second gate. A width of the second word line is different from a width of the first word line.

In accordance with various embodiments, the width of the second word line is greater than the width of the first word line.

In accordance with various embodiments, the first reading device and the first programming device are implemented with one or more equivalent transistors.

In accordance with various embodiments, the structure further comprises a voltage line coupled to the third gate and configured to receive a reference voltage.

Also disclosed is a device that includes a first active region, a first pair of transistors, a second pair of transistors, at least one first dummy transistor, and a first bit line. The first active region includes a semiconductor material and extending in a first direction. The first pair of transistors, on the first active region, includes two first gates crossing over the first active region, a first source/drain region, and a second source/drain region. The first gates are arranged between the first source/drain region and the second source/drain region. The second pair of transistors, on the first active region, includes two second gates crossing over the first active region, a third source/drain region, and a fourth source/drain region. The second gates are arranged between the third source/drain region and the fourth source/drain region. The at least one first dummy transistor, on the first active region, includes at least one dummy gate crossing over the first active region and arranged between the first gates and the second gates. The first bit line, over the first active region, extends in the first direction. The first bit line is coupled to the first source/drain region and the third source/drain region.

In accordance with various embodiments, the at least one dummy transistor comprises a first dummy transistor and a second dummy transistor. The first dummy transistor includes a first dummy gate crossing over the first active region, and the first dummy transistor and one of the first pair of transistors share the second source/drain region. The second dummy transistor includes a second dummy gate crossing over the first active region, and the second dummy transistor and one of the second pair of transistors share the fourth source/drain region.

In accordance with various embodiments, the at least one dummy gate is coupled to a reference voltage line or is electrically floating.

In accordance with various embodiments, the device further comprises a third pair of transistors including two third gates. The third gates cross over the first active region, the second gates are arranged between the at least one dummy gate and the third gates, and one of the second pair of transistors and one of the third pair of transistors share the third source/drain region that is coupled to the first bit line.

In accordance with various embodiments, the device further comprises a second active region, a third pair of transistors, a fourth pair of transistors, at least one second dummy transistor, and a second bit line. The second active region includes the semiconductor material and extends in the first direction. The first active region and the second active region are separate from each other. The third pair of transistors, on the second active region, includes the first gates crossing over the second active region, a fifth source/drain region, and a sixth source/drain region, and the first gates are arranged between the fifth source/drain region and the sixth source/drain region. The fourth pair of transistors, on the second active region, includes the second gates crossing over the second active region, a seventh source/drain region, and an eighth source/drain region, and the second gates are arranged between the seventh source/drain region and the eighth source/drain region. The at least one second dummy transistor, on the second active region, including the at least one dummy gate crossing over the second active region. The first bit line, over the first active region, extends in the first direction, and the first bit line is coupled to the first source/drain region and the third source/drain region.

In accordance with various embodiments, the device further comprises a plurality of metal segments separate from each other between the first bit line and the second bit line. The plurality of metal segments, the first bit line, and the second bit line are disposed in a same layer. One of the first gates is coupled through a first metal segment in the plurality of metal segments to a first word line, and/or one of the second gates is coupled through a second metal segment in the plurality of metal segments to a second word line.

In accordance with various embodiments, the device further comprises a plurality of metal segments, a first word line, and a second word line. The plurality of metal segments are separate from the first bit line, wherein the plurality of metal segments and the first bit line are disposed in a same layer. The first word line extends in a second direction different from the first direction, and the first word line is coupled through a first metal segment in the plurality of metal segments to one of the first gates. The second word line extends in the second direction, and the second word line is coupled through a second metal segment in the plurality of metal segments to one of the second gates.

In accordance with various embodiments, the device further comprises a first word line and a second word line coupled to the first gates, respectively. An area of the first word line is greater than an area of the second word line.

Also disclosed is a device that includes a plurality of active regions, a plurality of gates, a plurality of bit lines, a first plurality of word lines, and a second plurality of word lines. The plurality of active regions extend in a first direction, and the plurality of active regions are separate from each other and include a semiconductor material. The plurality of gates extend in a second direction different from the first direction, and each gate in the plurality of gates crosses over the plurality of active regions, and the plurality of gates include a first plurality of gates, a second plurality of gates, and at least one dummy gate. The plurality of bit lines extend in the first direction above the plurality of active regions, respectively, and are disposed in a first metal layer. Each bit line in the plurality of bit lines crosses over the plurality of gates and is coupled to a first portion and a second portion of a corresponding active region in the plurality of active regions. The first plurality of word lines and the second plurality of word lines extend in the second direction and are disposed in a second metal layer above the first metal layer. The first plurality of gates are coupled to the first plurality of word lines, and the second plurality of gates are coupled to the second plurality of word lines. In a top view of the device, the at least one dummy gate is arranged between a first gate and a second gate in the first plurality of gates, the first gate and the second gate are arranged between a third gate and a fourth gate in the second plurality of gates, and the third gate and the fourth gate are arranged between the first portion and the second portion of the corresponding active region.

In accordance with various embodiments, the device further comprises a first plurality of metal segments and a second plurality of metal segments. The first plurality of metal segments are arranged between a first bit line and a second bit line in the plurality of bit lines. The second plurality of metal segments are arranged between the second bit line and a third bit line in the plurality of bit lines. The first plurality of metal segments and the second plurality of metal segments are disposed in the first metal layer. Each metal segment in the first plurality of metal segments and the second plurality of metal segments couples one gate in the plurality of gates to one word line in the first plurality of word lines and the second plurality of word lines.

In accordance with various embodiments, the first plurality of metal segments includes first groups and second groups of metal segments. Each one of the first groups includes two metal segments coupled to two gates in the first plurality of gates, and each one of the second groups includes one metal segment coupled to one gate in the second plurality of gates.

In accordance with various embodiments, the second plurality of metal segments includes third groups and fourth groups of metal segments. Each one of the third groups includes two metal segments coupled to two gates in the first plurality of gates, and each one of the fourth groups includes one metal segment coupled to one gate in the second plurality of gates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first active region including a semiconductor material and extending in a first direction;
    a first pair of transistors, on the first active region, including a first pair of gates crossing over the first active region, a first source/drain region, and a second source/drain region, wherein the first pair of gates are arranged between the first source/drain region and the second source/drain region;
    a second pair of transistors, on the first active region, including a second pair of gates crossing over the first active region, a third source/drain region, and a fourth source/drain region, wherein the second pair of gates are arranged between the third source/drain region and the fourth source/drain region;
    at least one dummy transistor, on the first active region, including at least one dummy gate crossing over the first active region and arranged between the first pair of gates and the second pair of gates, the at least one dummy transistor corresponding to at least one non-functional transistor;
    a first bit line, over the first active region, extending in the first direction, wherein the first bit line is electrically coupled to the first source/drain region and the third source/drain region; and
    a first via positioned between the third source/drain region and the first bit line, the first via electrically coupling the third source/drain region and the first bit line together.

2. The device of claim 1, wherein the at least one dummy transistor comprises:
a first dummy transistor including a first dummy gate crossing over the first active region, wherein the first dummy transistor and one of the first pair of transistors share the second source/drain region; and
a second dummy transistor including a second dummy gate crossing over the first active region, wherein the second dummy transistor and one of the second pair of transistors share the fourth source/drain region.

3. The device of claim 1, wherein the at least one dummy gate is coupled to a reference voltage line.

4. The device of claim 1, further comprising:
a third pair of transistors including a third pair of gates, wherein the third pair of gates cross over the first active region, the second pair of gates are arranged between the at least one dummy gate and the third pair of gates, and one of the second pair of transistors and one of the third pair of transistors share the third source/drain region that is coupled to the first bit line.

5. The device of claim 1, further comprising:
a second active region including the semiconductor material and extending in the first direction, wherein the first active region and the second active region are separate from each other;
a third pair of transistors, on the second active region, including the first pair of gates crossing over the second active region, a fifth source/drain region, and a sixth source/drain region, wherein the first pair of gates are arranged between the fifth source/drain region and the sixth source/drain region;
a fourth pair of transistors, on the second active region, including the second pair of gates crossing over the second active region, a seventh source/drain region, and an eighth source/drain region, wherein the second pair of gates are arranged between the seventh source/drain region and the eighth source/drain region;
at least one second dummy transistor, on the second active region, including the at least one dummy gate crossing over the second active region; and
a second bit line, over the second active region, extending in the first direction, wherein the second bit line is coupled to the fifth source/drain region and the eighth source/drain region.

6. The device of claim 5, further comprising:
a plurality of metal segments separated from each other and between the first bit line and the second bit line, wherein the plurality of metal segments, the first bit line, and the second bit line are disposed in a same layer;
wherein one of the first pair of gates is coupled through a first metal segment of the plurality of metal segments to a first word line, and/or one of the second pair of gates is coupled through a second metal segment of the plurality of metal segments to a second word line.

7. The device of claim 1, further comprising:
a plurality of metal segments separated from the first bit line, wherein the plurality of metal segments and the first bit line are disposed in a same layer;
a first word line extending in a second direction different from the first direction, wherein the first word line is coupled through a first metal segment of the plurality of metal segments to one of the first pair of gates; and
a second word line extending in the second direction, wherein the second word line is coupled through a second metal segment of the plurality of metal segments to one of the pair of second gates.

8. The device of claim 1, further comprising:
a first word line and a second word line coupled to the first pair of gates, respectively;
wherein an area of the first word line is greater than an area of the second word line.

9. The device of claim 1, wherein the at least one dummy gate is electrically floating.

10. A device comprising:
a first active region extending in a first direction;
a first pair of transistors including a first pair of gates overlapping the first active region and extending in a second direction different from the first direction, a first source/drain region in the first active region, and a second source/drain region in the first active region, wherein the first pair of gates are between the first source/drain region and the second source/drain region;
a second pair of transistors including a second pair of gates overlapping the first active region and extending in the second direction, a third source/drain region in the first active region, and a fourth source/drain region in the first active region, wherein the second pair of gates are between the third source/drain region and the fourth source/drain region;
a first dummy transistor including a first dummy gate overlapping the first active region, extending in the second direction, and being between the first pair of gates and the second pair of gates, the first dummy transistor corresponding to a first non-functional transistor;
a first bit line extending in the first direction and overlapping the first active region, wherein the first bit line is electrically coupled to the first source/drain region and the third source/drain region; and
a first via positioned between the third source/drain region and the first bit line, the first via electrically coupling the third source/drain region and the first bit line together.

11. The device of claim 10, wherein the first dummy transistor and one of the first pair of transistors share the second source/drain region.

12. The device of claim 11, further comprising:
a second dummy transistor including a second dummy gate overlapping the first active region, extending in the second direction, and being separated from the first dummy gate in the first direction, wherein the second dummy transistor and one of the second pair of transistors share the fourth source/drain region.

13. The device of claim 12, wherein the first dummy gate and the second dummy gate are coupled to a reference voltage supply.

14. The device of claim 12, wherein the first dummy gate and the second dummy gate are electrically floating.

15. The device of claim 10, further comprising:
a second active region extending in the first direction, and being separated from the first active region in the second direction;
a third pair of transistors including the first pair of gates, the first pair of gates overlapping the second active region, a fifth source/drain region in the second active region, and a sixth source/drain region in the second active region, wherein the first pair of gates are between the fifth source/drain region and the sixth source/drain region;
a fourth pair of transistors including the second pair of gates, the second pair of gates overlapping the second active region, a seventh source/drain region in the second active region, and an eighth source/drain region in the second active region, wherein the second pair of gates are between the seventh source/drain region and the eighth source/drain region;
a second dummy transistor including the first dummy gate, the first dummy gate overlapping the second active region; and
a second bit line extending in the first direction, overlapping the first active region and being separated from the first bit line in the second direction, wherein the second bit line is electrically coupled to the fifth source/drain region and the eighth source/drain region.

16. The device of claim 15, further comprising:
a set of conductive segments extending in the first direction, being separated from each other in the first direction, and being between the first bit line and the second bit line, wherein the set of conductive segments, the first bit line, and the second bit line are in a same metal layer;
wherein one of the first pair of gates is coupled through a first conductive segment of the set of conductive segments to a first word line.

17. The device of claim 10, further comprising:
a third pair of transistors including a third pair of gates overlapping the first active region and extending in the second direction, the second pair of gates are between the first dummy gate and the third pair of gates, and one of the second pair of transistors and one of the third pair of transistors share the third source/drain region, and the third source/drain region is coupled to the first bit line.

18. The device of claim 10, further comprising:
a first word line having a first area; and
a second word line having a second area greater than the first area;
the first word line being coupled to a first gate of the first pair of gates, and
the second word line being coupled to a second gate of the first pair of gates.

19. A device comprising:
a first active region extending in a first direction and including a semiconductor material;
a first pair of transistors including a first pair of gates overlapping the first active region and extending in a second direction different from the first direction, a first source/drain region in the first active region, and a second source/drain region in the first active region, wherein the first pair of gates are between the first source/drain region and the second source/drain region;
a second pair of transistors including a second pair of gates overlapping the first active region and extending in the second direction, a third source/drain region in the first active region, and a fourth source/drain region in the first active region, wherein the second pair of gates are between the third source/drain region and the fourth source/drain region;
a first dummy transistor including a first dummy gate overlapping the first active region, extending in the second direction, and being between the first pair of gates and the second pair of gates, the first dummy transistor corresponding to a first non-functional transistor;
a first bit line extending in the first direction, overlapping the first active region, being on a first metal layer, and being electrically coupled to the first source/drain region and the third source/drain region;
a first via positioned between the third source/drain region and the first bit line, the first via electrically coupling the third source/drain region and the first bit line together; and
a first word line extending in the second direction, overlapping the first active region, being electrically coupled to a first gate of the first pair of gates, and being on a second metal layer above the first metal layer.

20. The device of claim 19, further comprising:
a second dummy transistor including a second dummy gate overlapping the first active region, extending in the second direction, and being separated from the first dummy gate in the first direction,
wherein the second dummy transistor and one of the second pair of transistors share the fourth source/drain region; and the first dummy transistor and one of the first pair of transistors share the second source/drain region.

* * * * *